(12) United States Patent
Shimizu et al.

(10) Patent No.: US 7,095,649 B2
(45) Date of Patent: Aug. 22, 2006

(54) SEMICONDUCTOR INTEGRATED CIRCUIT DEVICE

(75) Inventors: Yuui Shimizu, Yokohama (JP); Kenji Tsuchida, Kawasaki (JP)

(73) Assignee: Kabushiki Kaisha Toshiba, Tokyo (JP)

(*) Notice: Subject to any disclaimer, the term of this patent is extended or adjusted under 35 U.S.C. 154(b) by 79 days.

(21) Appl. No.: 10/952,721

(22) Filed: Sep. 30, 2004

(65) Prior Publication Data

US 2005/0213401 A1    Sep. 29, 2005

(30) Foreign Application Priority Data

Mar. 23, 2004   (JP) ............................ 2004-085577

(51) Int. Cl.
    *G11C 11/00*    (2006.01)
(52) U.S. Cl. .................. 365/158; 365/200; 365/171; 365/225.5; 365/189.08
(58) Field of Classification Search ................ 365/158, 365/200, 171, 209, 225.5, 243.5, 189.08
    See application file for complete search history.

(56) References Cited

U.S. PATENT DOCUMENTS

| | | | |
|---|---|---|---|
| 6,683,807 B1 * | 1/2004 | Hidaka | 365/161 |
| 6,865,103 B1 * | 3/2005 | Hidaka | 365/158 |
| 6,882,565 B1 | 4/2005 | Tsuchida | 365/171 |
| 6,885,579 B1 * | 4/2005 | Sakimura et al. | 365/158 |
| 2004/0037112 A1 * | 2/2004 | Ooishi | 365/185.09 |

FOREIGN PATENT DOCUMENTS

JP    2005-71484    3/2005

OTHER PUBLICATIONS

A. Bette, et al. "A High-Speed 128Kbit MRAM Core for Future Universal Memory Applications", 2003 Symposium on VLSI Circuits Digest of Technical Papers, 2003, 4 Pages.

* cited by examiner

*Primary Examiner*—Anh Phung
*Assistant Examiner*—Toan Le
(74) *Attorney, Agent, or Firm*—Oblon, Spivak, McClelland, Maier & Neustadt, P.C.

(57) ABSTRACT

A semiconductor integrated circuit device includes a main memory cell array, redundant memory cell array, write current source, a common node connected to the write current source, a first selector connected between the common node and one-side ends of main write wirings and a second selector connected between the common node and one-side ends of redundant write wirings. The redundant memory cell array is arranged in a position apart from the main memory cell array and the write current source is commonly used by the main memory cell array and redundant memory cell array via the common node.

20 Claims, 14 Drawing Sheets

Reference Example

SEMICONDUCTOR INTEGRATED CIRCUIT DEVICE

CROSS-REFERENCE TO RELATED APPLICATIONS

This application is based upon and claims the benefit of priority from prior Japanese Patent Application No. 2004-085577, filed Mar. 23, 2004, the entire contents of which are incorporated herein by reference.

BACKGROUND OF THE INVENTION

1. Field of the Invention

This invention relates to a semiconductor integrated circuit device and more particularly to an MRAM (Magnetic Random Access Memory).

2. Description of the Related Art

An MRAM is one of the nonvolatile semiconductor memories utilizing the tunneling magneto resistive effect to store information according to a variation in the resistance.

In order to read out data from the MRAM, a tunnel current which passes through a tunnel insulating film having a thickness of approximately several nanometers and provided between a free layer and a fixed layer is used. A value of the tunnel current is finely changed according to the thickness of the tunnel insulating film. Further, since the tunnel insulating film is made thin, there occurs a possibility that the tunnel insulating film will be inadvertently broken in the processing operation and the free layer and fixed layer will be short-circuited.

At the data write time, a magnetic field generated by a current running, nearby the MTJ is used. It is understood that the write characteristic greatly varies according to the shape of a magnetic body, for example, an MTJ (Magnetic Tunnel Junction) element contained in a memory cell. However, it is difficult to completely eliminate a variation in the shape of the MTJ element at the manufacturing time even in future. It is presumed that the operation of writing data into the memory cell cannot be performed when even a slight variation occurs in the shape of the MTJ element.

Under these circumstances, in the MRAM, there occurs a strong possibility that memory cells (faulty memory cells) having a characteristic significantly different from that defined in the specification at the write time and read time will be provided in a main memory cell array. Therefore, it is considered necessary to replace the above memory cells by redundant memory cells in order to enhance the manufacturing yield.

In a document 1, it is described that a write current for each line of WL, BL is approximately 5 mA. It is also difficult even in future to reduce the write current. One of the reasons is that the MTJ element becomes less resistant to thermal disturbance in a case where the MTJ element is designed to permit the write operation to be easily performed by use of a small current. Due to this, the advantage of the MRAM which can be used as the nonvolatile semiconductor memory will be lost in some cases.

Further, a demagnetizing field becomes stronger with miniaturization of the memory cells and, as a result, a switching magnetic field which is required to be applied to the MTJ from the exterior becomes stronger.

This means that the area of a current source which generates a write current, for example, the area occupied by a driver transistor becomes larger. In practice, it is desirable to suppress the ratio of the area of the driver transistor to the whole area of the chip to minimum.

On the other hand, the redundancy technique for replacing a faulty bit in the memory cell array by a normal bit includes the row redundancy technique for performing the replacement operation in the row unit and the column redundancy technique for performing the replacement operation in the column unit. In this specification, it is assumed that a redundant memory cell array for column redundant which is different from the main memory array is arranged in the chip. Further, it is assumed that a plurality of driver transistors used to supply write currents to write word lines of the main memory cells are commonly used in the main memory cell array and are connected to the write word lines by use of switches controlled by a decoder. According to the above method, since the driver transistors which require a large area can be arranged along the main memory array, the height of the memory cell array (the length of the memory cell array in the column direction) can be made small.

In this case, normally, since the size of the redundant memory cell array is smaller than the size of the main memory array, a region in which the driver transistors are arranged projects from the redundant memory cell array, for example, if the driver transistors are arranged in the redundant memory cell array in the same manner as in the main memory cell array. The layout thus attained acts against the intention of reducing the chip area.

Document 1: A. Bette et al., "A High-Speed 128 kbit MRAM Core for Future Universal Memory Applications" 2003 Symposium on VLSI Circuits Digest of Technical Papers, p. 217.

BRIEF SUMMARY OF THE INVENTION

A semiconductor integrated circuit device according to an aspect of the invention comprises a main memory cell array having memory cells arranged in a matrix form and including at least one magneto-resistance effect element; a redundant memory cell array having memory cells arranged in a matrix form and including at least one magneto-resistance effect element used to compensate for a fault occurring in the main memory cell array, the redundant memory cell array being arranged in a position apart from the main memory cell array; main write wirings arranged on the main memory cell array; redundant write wirings arranged on the redundant memory cell array; a write current source; a common node connected to the write current source; a first selector connected between the common node and one-side ends of the main write wirings; a second selector connected between the common node and one-side ends of the redundant write wirings; a third selector connected to the other ends of the main write wirings; and a fourth selector connected to the other ends of the redundant write wirings.

DETAILED DESCRIPTION OF THE INVENTION

There will now be described embodiments of this invention with reference to the accompanying drawings. In this explanation, common reference symbols are attached to like portions throughout the drawings.

FIRST EMBODIMENT

Figure 1:
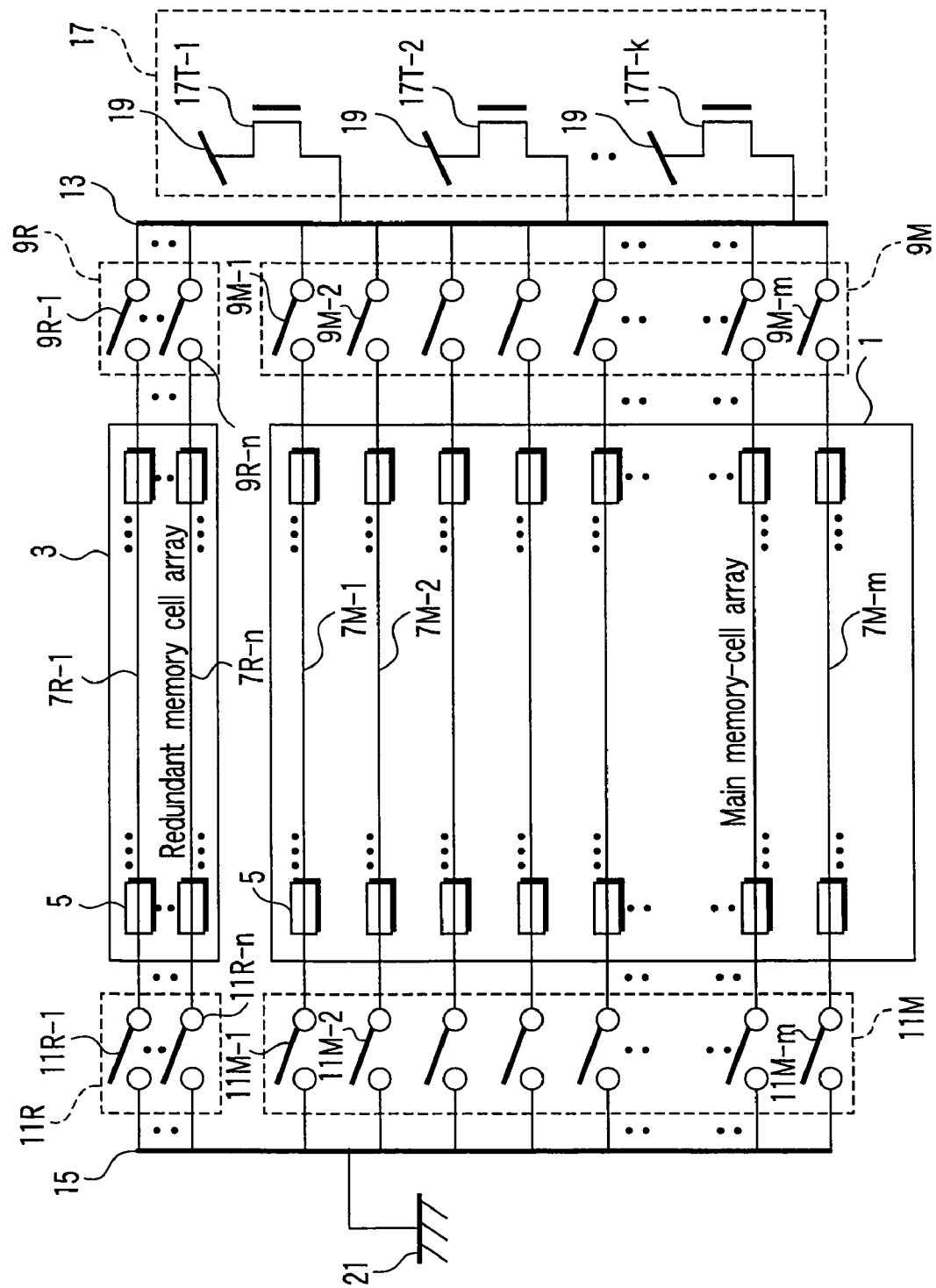
FIG. 1 is a block diagram showing one example of the configuration of a semiconductor integrated circuit device according to a first embodiment of this invention.

FIG. 1 is a block diagram showing one example of the configuration of a semiconductor integrated circuit device according to a first embodiment of this invention.

As shown in FIG. 1, a main memory cell array 1 and redundant memory cell array 3 are formed on a semiconductor integrated circuit chip. The main memory cell array 1 is a memory cell array normally used and the redundant memory cell array 3 is a memory cell array used to relieve faulty rows or faulty columns occurring in the main memory cell array 1. For example, the faulty row or faulty column occurring in the main memory cell array 1 is replaced by a row or column of the redundant memory cell array 3. The redundant memory cell array 3 of this example is a memory cell array formed independently from the main memory cell array 1 and arranged in a position apart from the main memory cell array 1.

Memory cells 5 are arranged in the main memory cell array 1 and redundant memory cell array 3. One example of the memory cell 5 is an MRAM cell containing a magneto-resistance effect element. One example of the magneto-resistance effect element is an MTJ element. The memory cells 5 are arranged at intersections between row lines (word lines and write word lines) and column lines (bit lines) and arranged in a matrix form in the main memory cell array 1 and redundant memory cell array 3. In FIG. 1, only row lines 7 among the row lines and column lines are shown. Further, the row lines 7 show only write wirings, for example, write word lines used at the write time. In this example, it is assumed that, at the data write time, a current field is generated in the easy-axis direction by passing a current through the column line and a current field is generated in the hard-axis direction by passing a current through the row line 7. If shape of the MTJ element has a magnetic anisotropic, the lengthwise direction of the MTJ element is set in the hard-axis direction. Therefore, the row lines 7 are arranged in the lengthwise direction of the MTJ element.

Figure 2:
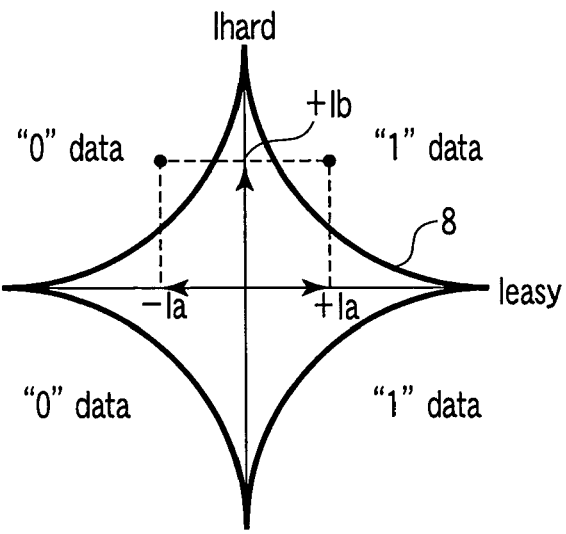
FIG. 2 is a diagram showing the write characteristic of an MTJ element.

FIG. 2 is a diagram showing the write characteristic of the MTJ element.

"Ihard" shown in FIG. 2 indicates a current which causes a magnetic field to be generated in the hard-axis direction and indicates a current flowing through the row line 7 in this example. Likewise, "Ieasy" indicates a current which causes a magnetic field to be generated in the easy-axis direction and indicates a current flowing through the column line in this example. An internal area of asteroid curve 8 is an area in which the write operation is not performed and an outside area thereof is an area in which the write operation is performed. Data "1" is written into areas of the first and fourth quadrants lying in the area in which the write operation is performed and data "0" is written into areas of the second and third quadrants. In order to write data into the MRAM cell containing the MTJ element, currents are passed through two axes (hard axis, easy axis). Assume that the write operation is performed by use of the first and second quadrants. In this case, when data "1" is written, a current Ihard with a current value +Ib is caused to flow through the row line 7 and a current Ieasy with a current value +Ia is caused to flow through the column line. Likewise, when data "0" is written, the current Ihard with the current value +Ib is caused to flow through the row line 7 and a current Ieasy with a current value −Ia is caused to flow through the column line. At this time, the current values Ia, Ib are set at several mA, for example, 5 mA or more.

In the following explanation, the row lines 7 are referred to as write wirings 7. Further, the write wirings 7 arranged in the main memory cell array 1 are referred to as main write wirings 7M (7M-1, 7M-2, . . . , 7M-m) and the write wirings 7 arranged in the redundant memory cell array 3 are referred to as redundant write wirings 7R (7R-1, 7R-2, . . . , 7R-n).

One-side ends of the main write wirings 7M are connected to one-side ends of selectors 9M (9M-1, 9M-2, . . . , 9M-m) and the other ends thereof are connected to one-side ends of selectors 11M (11M-1, 11M-2, . . . , 1M-m). Likewise, one-side ends of the redundant write wirings 7R are connected to one-side ends of selectors 9R (9R-1, 9R-2, . . . , 9R-m) and the other ends thereof are connected to one-side ends of selectors 11R (11R-1, 11R-2, . . . , 11R-m). The other ends of the selectors 9M, 9R are connected to a common node 13 and the other ends of the selectors 11M, 11R are connected to a common node 15.

The common node 13 is connected to a current source 17. One example of the current source 17 is a driver transistor 17T having a source connected to a high potential power supply terminal 19 and a drain connected to the common node 13. In this example, a plurality of driver transistors 17T (17-1, 17-2, . . . , 17-k) are provided and connected in parallel between the high potential power supply terminal 19 and the common node 13. Further, the common node 15 is connected to a current discharging terminal 21. One example of the current discharging terminal 21 is a power supply terminal whose potential is set lower than the high potential power supply terminal 19, for example, a ground terminal.

The selectors 9M, 9R, 11M, 11R are selected by a row decoder (not shown), for example, and set in the ON state when they are set in the selected state and set in the OFF state when they are set in the non-selected state. The main write wiring 7M connected to the selectors 9M, 11M set in the selected state is connected to the common node 13 and common node 15 to permit a current to flow from the current source 17 to the current discharging terminal 21. Like the main write wiring 7M, the redundant write wiring 7R connected to the selectors 9R, 11R set in the selected state is connected to the common node 13 and common node 15 to permit a current to flow from the current source 17 to the current discharging terminal 21.

The above currents are the current Ihard explained in FIG. 2 and the current value Ia thereof is 5 mA or more, for example. A current of 5 mA is excessively large in the field of semiconductor integrated circuit devices. Therefore, it is necessary to increase the size of the current source 17, for example, the gate length and gate width of the driver transistor 17T. Further, the driver transistors 17T may be connected in parallel between the high potential power supply terminal 19 and the common node 13 in some cases as shown in this example. Based on the above facts, the current source 17 occupies a large area in the semiconductor chip and this is one of the factors which prevent the semiconductor chip from being miniaturized.

Figure 3:
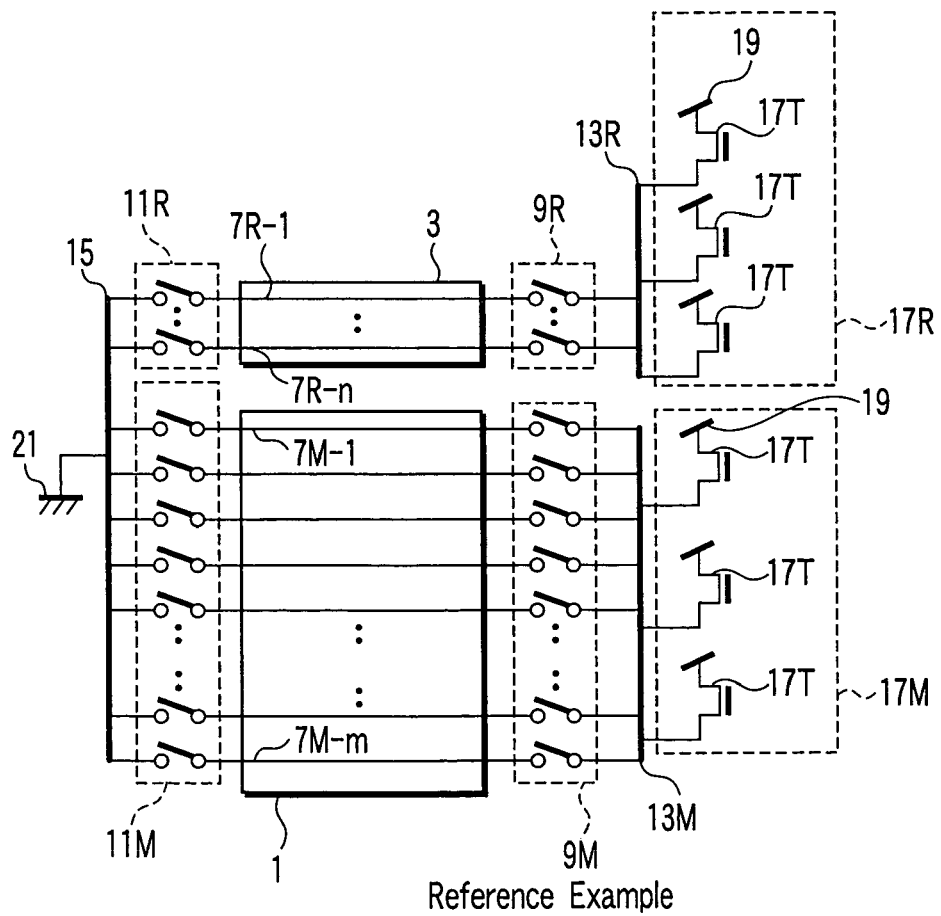
FIG. 3 is a block diagram showing a semiconductor integrated circuit device according to a reference example of this invention.

A reference example is shown in FIG. 3. As shown in the reference example, assume that current sources 17 are provided in correspondence to the main memory cell array 1 and redundant memory cell array 3. In this case, a current supply 17R for the redundant memory cell array is connected to the selector 9R via a common node 13R and a current supply 17M for the main memory cell array is connected to the selector 9M via a common node 13M. The current driving ability required for the driver transistor 17T is basically the same in both of the current sources 17R and 17M. Therefore, the circuit area required for the current source 17R tends to be equal to the circuit area required for the current source 17M. Further, when the number n of row lines in the redundant memory cell array 3 is smaller than the number m of row lines in the main memory cell array 1, the area of the redundant memory cell array 3 becomes smaller than the area of the main memory cell array 1 as in the present embodiment and in the reference example. For example, even when the length of the redundant memory cell array 3 along the row line 7 is the same as that of the main memory cell array 1, the length of the redundant memory cell array 3 along the column line (not shown) becomes shorter than that of the main memory cell array 1. In this case, as shown in the reference example, the length of the current source 17R along the column line becomes larger than that of the redundant memory cell array 3 and the current source 17R projects from the redundant memory cell array 3. The projecting portion itself increases the area of the semiconductor chip and is unfavorable in miniaturizing the semiconductor chip.

In the device according to the first embodiment, the current source 17 is commonly used by the main memory cell array 1 and redundant memory cell array 3. Therefore, occurrence of a problem that the current source 17 projects from the redundant memory cell array 3 can be suppressed. Therefore, the device according to the first embodiment is advantageous over the reference example in miniaturization of the semiconductor chip. Further, in the device according to the first embodiment, the number of the current source 17, for example, the number of driver transistors 17T can be reduced and the ratio of the area of the current source 17 to the whole area of the semiconductor chip can be made as small as possible in comparison with the reference example. This is also advantageous in miniaturization of the semiconductor chip.

Next, one example of the circuit of the device according to the first embodiment is explained.

Figure 4:
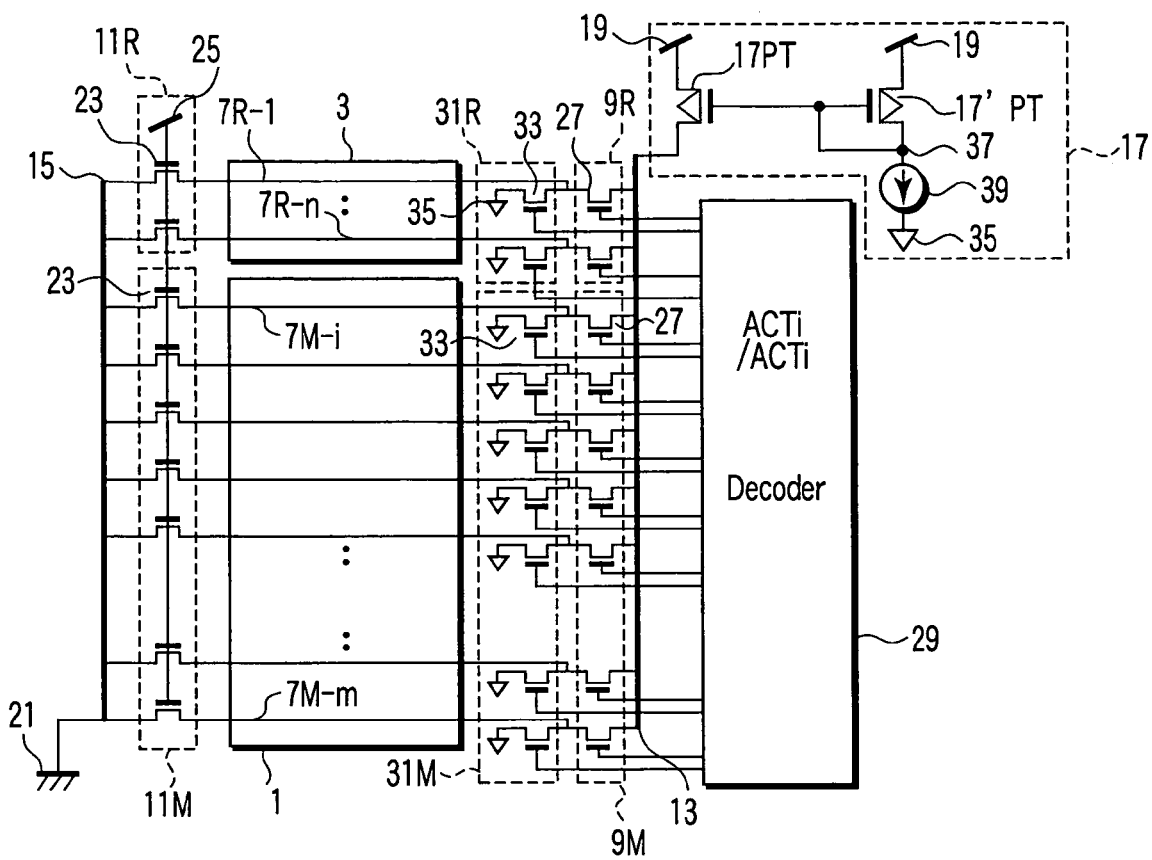
FIG. 4 is a circuit diagram showing one example of the circuit of the semiconductor integrated circuit device according to the first embodiment of this invention.

FIG. 4 is a circuit diagram showing one example of the circuit of the semiconductor integrated circuit device according to the first embodiment of this invention.

As shown in FIG. 4, in this circuit example, N-channel transistors 23 are used in the selectors 1M, 11R on the current discharging terminal 21 side, for example. The gate of the transistor 23 is connected to a high-potential power supply terminal 25, for example. The gate potential of the transistor 23 is fixed at the high potential and the transistor 23 is normally set in the ON state. The transistor 23 functions as a write word line sinker.

In this circuit example, N-channel transistors 27 are used in the selectors 9M, 9R on the current source 17 side, for example. The transistor 27 is controlled by an output ACTi of a decoder 29. The decoder 29 outputs an output ACTi of "H" level to a selected one of the transistors 27 and outputs an output ACTi of "L" level to the non-selected transistors 27. The selected transistor 27 is set in the ON state and the non-selected transistor 27 is set in the OFF state. Further, in this circuit example, selectors 31M, 31R are provided on the current source 17 side. In this circuit example, N-channel transistors 33 are used in the selectors 31M, 31R. One-side ends of the current paths of the transistors 33 provided in the selector 31M are connected to the respective main write wirings 7M and the other ends thereof are connected to a low-potential power supply terminal, for example, ground terminal 35. Likewise, one-side ends of the current paths of the transistors 33 provided in the selector 31R are connected to the respective redundant write wirings 7R and the other ends thereof are connected to the ground terminal 35, for example. The transistor 33 is controlled by an output /ACTi of the decoder 29. The decoder 29 outputs an output /ACTi of "L" level to a selected one of the transistors 33 and outputs an output /ACTi of "H" level to the non-selected transistors 33. The selected transistor 33 is set in the OFF state and the non-selected transistor 27 is set in the ON state. A selected one of the write wirings 7M, 7R is connected to the common node 13 and the non-selected write wirings are connected to the ground terminal 35 by use of the selectors 9M, 9R, 31M, 31R. Thus, the selected one of the write wirings 7M, 7R permits a current to flow from the current source 17 to the current discharging terminal 21 and the non-selected ones of the write wirings 7M, 7R are grounded.

One example of the current source 17 is a constant current source circuit. One example of the constant current source circuit is a current mirror circuit. The current mirror circuit of this example includes a P-type driver transistor 17PT as the driver transistor 17. The source of the transistor 17PT is connected to a high-potential power supply terminal 19, the drain thereof is connected to the common node 13 and the gate thereof is connected to the gate and drain of an input-stage P-channel transistor 17'PT. The source of the transistor 17'PT is connected to the high-potential power supply terminal 19. An interconnection node 37 of the gate of the driver transistor 17PT and the gate and drain of the input-stage transistor 17'PT is connected to one end of the current path of a current source 39. The other end of the current path of the current source 39 is connected to a ground terminal 35, for example. In this example, the current source 17 is configured by a constant current source circuit, for example, a current mirror circuit and controls a current flowing through the driver transistor 17PT by use of the input-stage transistor 17'PT and current source 39. By using the current source 17, the current flowing through the driver transistor 17PT can be controlled so as not to be larger than necessary.

Further, the selectors 31M, 31R have a role of grounding the non-selected write wirings 7M, 7R and can have a role of suppressing the peak values of currents flowing through the write wirings 7M, 7R. This is explained below.

The operation of suppressing the current peak explained below is described in the prior patent application made by one of the inventors of this application and filed with the Japanese Patent Office by the applicant of this application. The application number and filing date of the prior patent application are Patent Application No. 2003-300509 and Aug. 25, 2003.

If the current source 17 is formed of the constant current source, the current supplied from the current source 17 can be controlled so as not to be larger than necessary. However, for example, the common node 13 is a wiring and has parasitic capacitance. In this example, the wiring used as the common node 13 is formed to extend from the main memory cell array 1 to the redundant memory cell array 3 and the wiring length of the wiring is extremely long. In addition, the wiring is connected to the source/drain diffusion regions of the transistors 27 contained in the selectors 9M, 9R. That is, the parasitic capacitance of the common node 13 is extremely large. While the device is being operated, the current source 17 is set in a normally conductive state, for example. Therefore, while the device is being operated, the common node 13 is set in a charging state. An extremely large amount of charges are stored on the common node 13 having the extremely large parasitic capacitance. If the transistors 27 contained in the selectors 9M, 9R are turned ON while a large amount of charges are stored, the charges stored on the parasitic capacitor of the common node 13 are instantly discharged toward the selected write wiring 7M, 7R. As a result, the peak value of the current flowing through the selected write wiring 7M, 7R becomes extremely large immediately after the write operation is started. If the current peak becomes extremely large, data may be erroneously written into the memory cell 5 connected to the selected write wiring 7M, 7R.

In order to suppress the peak value of the current flowing through the selected write wiring 7M, 7R, the transistors 33 contained in the selectors 31M, 31R may be controlled as follows.

Figure 5:
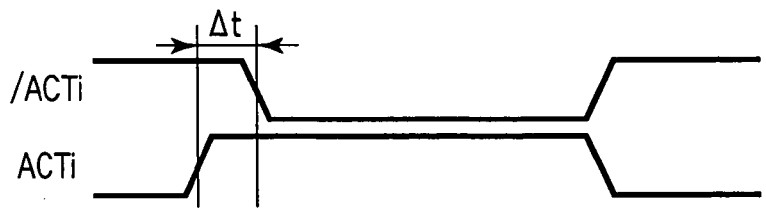
FIG. 5 is a signal waveform diagram showing a first example of the control operation of selectors 31M, 31R shown in FIG. 4.

FIG. 5 is a signal waveform diagram showing an example of the control operation of the selectors 31M, 31R.

In the first example of the control operation, basically, an output /ACTi of the decoder 29 is used as a complementary signal of an output ACTi. In this case, assume that a period Δt in which both of the outputs /ACTi and ACTi are set at an "H" level as shown in FIG. 5 is set immediately after the write operation is started, for example, immediately after the write wiring is selected. For example, time at which the output /ACTi starts to transit from the "H" level to the "L" level is delayed by "Δt" with respect to time at which the output ACTi starts to transit from the "L" level to the "H" level. In the period Δt, both of the transistors 27 contained in the selectors 9M, 9R and the transistors 33 contained in the selectors 31M, 31R are set in the ON state. As a result, charges stored on the parasitic capacitor of the common node 13 are discharged to the ground terminal 35 not via the write wiring 7M, 7R but via the transistors 27, 33 immediately after the write wiring is selected. In this case, since the current peak occurs immediately after the write wiring is selected, it occurs in the period Δt. After elapse of the period Δt, if the output /ACTi is transited from the "H" level to the "L" level, the transistor 33 is turned OFF. Then, a current flows from the common node 13 to the write wiring 7M, 7R via the transistor 27.

For example, by controlling the transistor 33 as shown in FIG. 5, the current peak in each of the write wirings 7M, 7R can be suppressed. The selectors 31M, 31R play a role as a current peak suppressing circuit.

Figure 6:
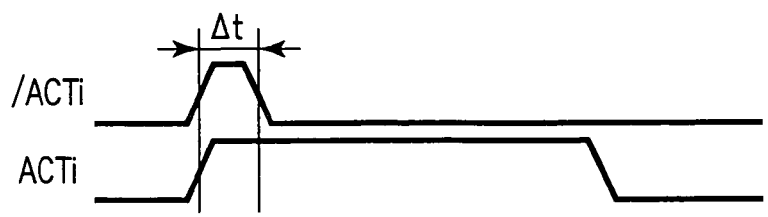
FIG. 6 is a signal waveform diagram showing a second example of the control operation of the selectors 31M, 31R shown in FIG. 4.

FIG. 6 is a signal waveform diagram showing a second example of the control operation of the selectors 31M, 31R.

In the first example of the control operation, the output /ACTi is basically used as the complementary signal of the output ACTi. Further, the selectors 31M, 31R are used as a selector and, at the same time, used as a current peak suppression circuit. On the other hand, in the second example of the control operation, the selectors 31M, 31R are specially designed as a so-called current peak suppression circuit.

As shown in FIG. 6, the output /ACTi is basically a signal at the "L" level. The output /ACTi starts to transit from the "L" level to the "H" level when the output ACTi which is complementary to the output /ACTi starts to transit from the "L" level to the "H" level. Then, a period Δt in which both of the outputs /ACTi and ACTi are set at the "H" level occurs. After elapse of the period Δt, the output /ACTi transits from the "H" level to the "L" level.

Like the first example of the control operation, in the second example of the control operation, the period Δt in which both of the outputs /ACTi and ACTi are set at the "H" level is set immediately after the write operation is started, for example, immediately after the write wiring is selected.

Therefore, like the first example of the control operation, in the second example of the control operation, the current peak can be suppressed.

Next, the write sequence of the device according to the first embodiment in which the write operation into the redundant memory cell array 3 is taken into consideration is explained.

Figure 7:
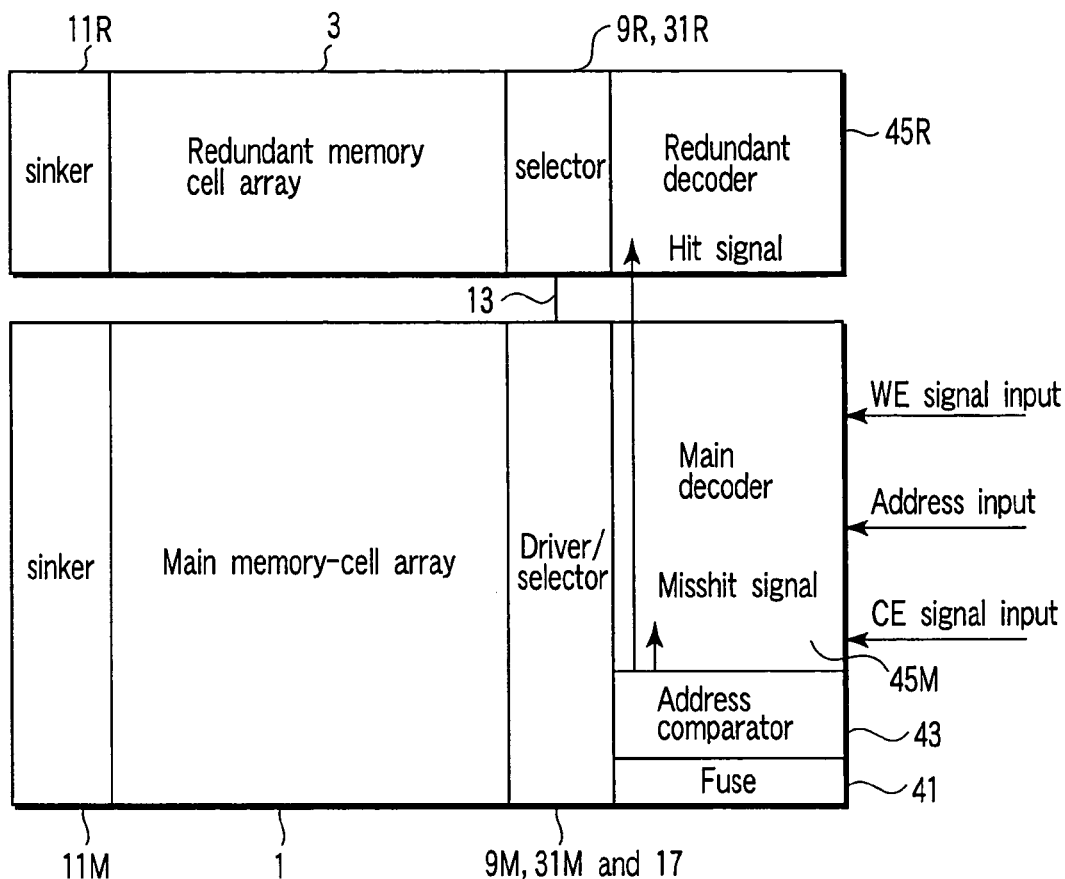
FIG. 7 is a block diagram showing one concrete example of the configuration of the device according to the first embodiment of this invention.
Figure 8:
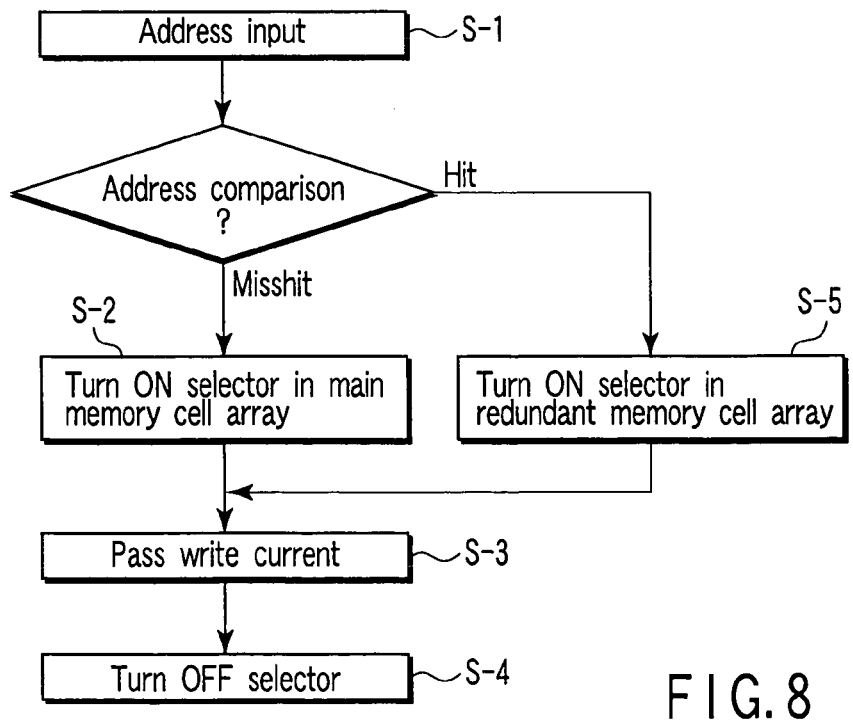
FIG. 8 is a flow diagram showing one example of the control operation of a write sequence of the device shown in FIG. 7.
Figure 9:
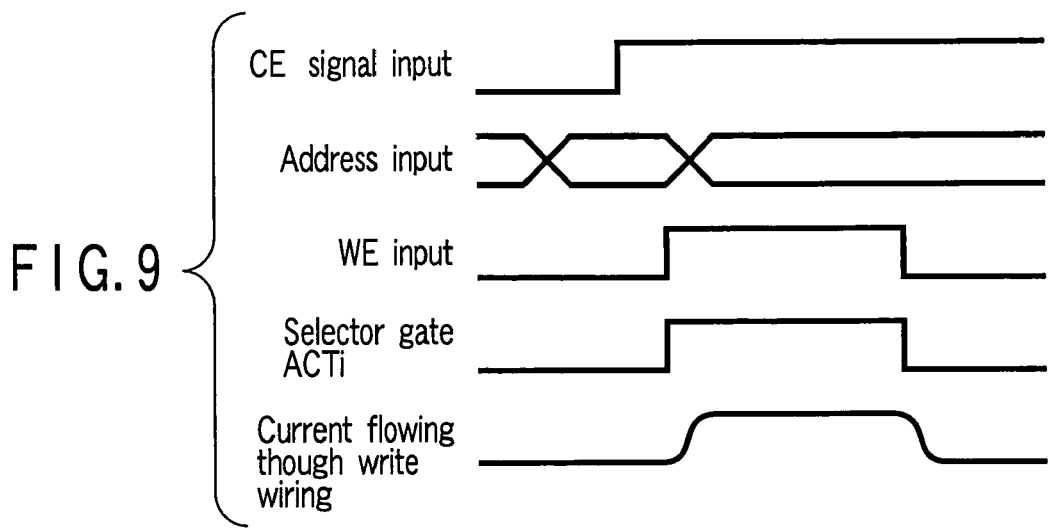
FIG. 9 is an operation waveform diagram showing one example of the operation in the write sequence of the device shown in FIG. 7.

FIG. 7 is a block diagram showing one concrete example of the configuration of the device according to the first embodiment of this invention, FIG. 8 is a flow diagram showing one example of the control operation of the write sequence of the device and FIG. 9 is an operation waveform diagram showing one example of the operation in the write sequence of the device. In this example, assume that a faulty row occurring in the main memory cell array 1 is replaced by a row in the redundant memory cell array 3.

The configuration and the operation of the device are explained below.

Information indicating one of rows of the redundant memory cell array 3 which is substituted for a faulty row occurring in the main memory cell array 1 is programmed in a fuse circuit 41. The program operation is performed by cutting a fuse of the fuse circuit 41 or not. For example, an address of the faulty row occurring in the main memory cell array 1 is programmed in the fuse circuit 41.

First, a chip enable signal CE is changed from the "L" level to the "H" level to enable the device shown in FIG. 7. Further, a write enable signal WE is changed from the "L" level to the "H" level to enable the write operation and an address is input to an address comparator circuit 43 from the exterior of the chip, for example (FIG. 8: step S-1).

The address comparator circuit 43 compares an input address with the address of the faulty row programmed in the fuse circuit 41 to determine whether or not the compared addresses are coincident with each other. If the compared addresses are not coincident (in the case of miss-hit), the address comparator circuit 43 outputs a miss-hit signal indicating the miss-hit to a main decoder 45M. The main decoder 45M outputs an output ACTi which is used to drive the gate of the selector to turn ON the selector in the main memory cell array 1 (FIG. 8: step S-2).

If the selector is thus turned ON, a write current is caused to flow through the selected write wiring 7M (FIG. 8: step S-3).

After a preset write time has elapsed, the selector is turned OFF (FIG. 8: step S-4).

Thus, data is written into the main memory cell array 1.

If the input address coincides with the address of the faulty row programmed in the fuse circuit 41 (in the case of hit), the address comparator circuit 43 outputs a hit signal indicating the hit to a redundant decoder 45R. The redundant decoder 45R outputs an output ACTi which is used to drive the gate of the selector to turn ON the selector in the redundant memory cell array 3 (FIG. 8: step S-5).

The operation performed after this is to pass the write current and turn OFF the selector and is the same as the operation performed at the time of selection of the main memory cell array 1.

Further, the block diagram of FIG. 7 also shows one example of the layout of the device according to the first embodiment.

As shown in FIG. 7, in one example of the layout, the current source (driver) 17 is provided on the main memory cell array 1 side. In other words, the current source 17 is not provided on the redundant memory cell array 3 side and the current source 17 of the main memory cell array 1 is used as the current source 17 of the redundant memory cell array 3.

In the above example of the layout, since the current source 17 of the main memory cell array 1 is used as the current source 17 of the redundant memory cell array 3, the current source 17 is not provided on the redundant memory cell array 3 side. Therefore, for example, as shown in the reference example of FIG. 3, a region in which the current source 17 is formed will not project from the redundant memory cell array 3. Therefore, it is advantageous in miniaturizing the semiconductor chip.

Next, one circuit example of the fuse circuit 41 and address comparator circuit 43 is explained.

Figure 10:
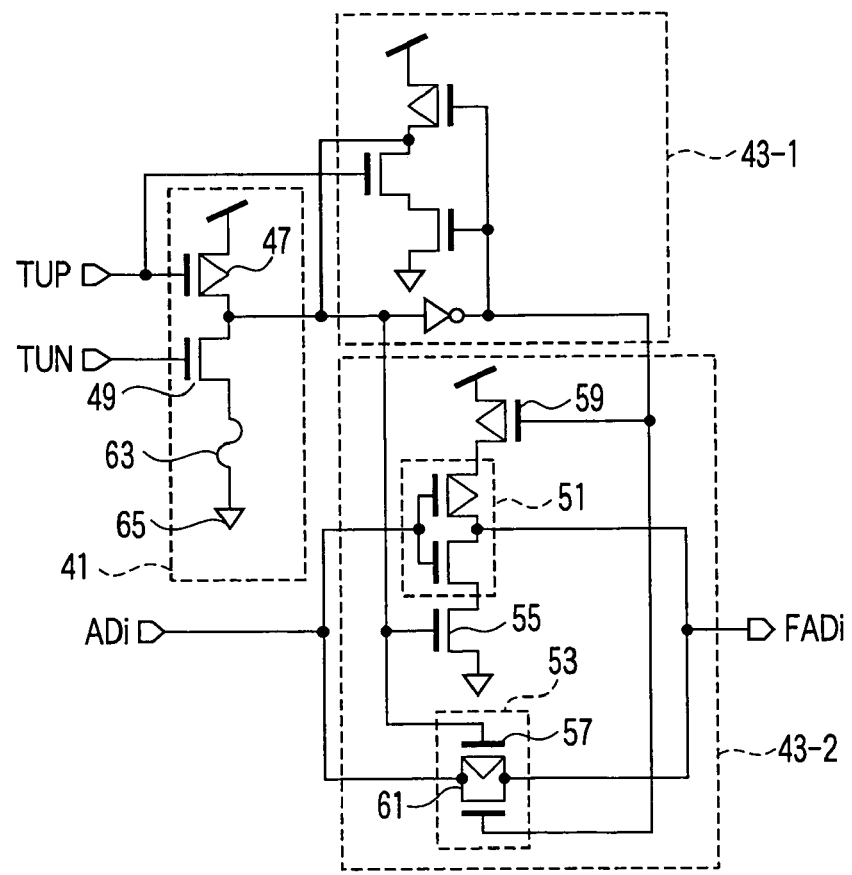
FIG. 10 is a circuit diagram showing one example of a fuse circuit 41 shown in FIG. 7.
Figure 11:
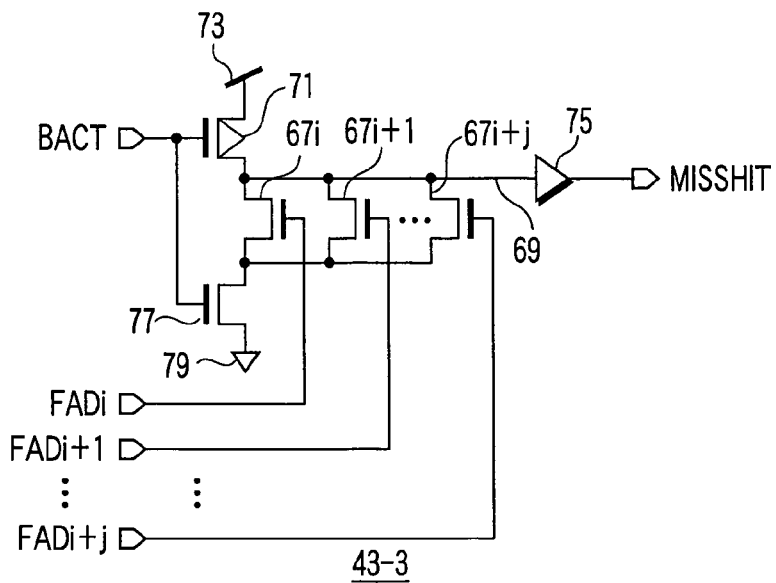
FIG. 11 is a circuit diagram showing one example of a miss-hit/hit determination circuit 41 in an address comparator circuit 43 shown in FIG. 7.
Figure 12:
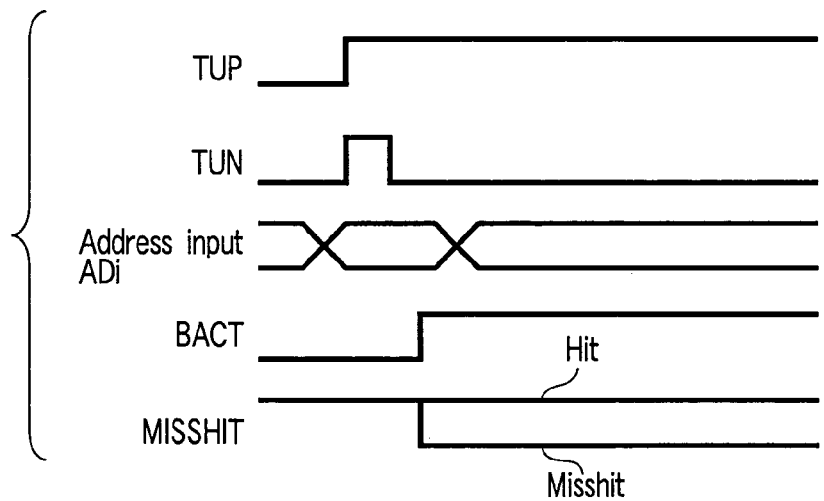
FIG. 12 is an operation waveform diagram showing one example of the operations of the fuse circuit 41 and address comparator circuit 43.

FIG. 10 is a circuit diagram showing one circuit example of the fuse circuit 41 and address comparator circuit 43. FIG. 11 is a circuit diagram showing one example of a miss-hit/hit determination circuit 41 in the address comparator circuit 43. FIG. 12 is an operation waveform diagram showing one example of the operations of the fuse circuit 41 and address comparator circuit 43. The circuit example schematically controls inversion/non-inversion of the logic of an input address according to a cut/non-cut state of a fuse. The circuit example is a circuit which determines that "an address of a faulty row is hit", for example, when the logic values of all of the input addresses which have been subjected to the inversion/non-inversion control operation are set to the logic value which determines "hit".

The configuration and operation are explained below.

First, as shown in FIG. 12, fuse circuit control signals TUP, TUN are both set at the "L" level. At this time, a P-channel transistor 47 of the fuse circuit 41 shown in FIG. 10 is set in the ON state and an N-channel transistor 49 is set in the OFF state. An output of the fuse circuit 41 is connected to an input of a latch circuit 43-1. The latch circuit 43-1 receives an "H" level output from the transistor 47 and latches the input and output thereof to the "H" level and "L" level. The input and output of the latch circuit 43-1 are connected to control inputs of an address comparison/transmission circuit 43-2.

The address comparison/transmission circuit 43-2 includes an inverting passage which inverts the logic of an address input ADi and a non-inverting passage which does not invert the same. The inverting passage includes an inverter circuit 51 and the non-inverting passage includes a transfer circuit 53. The input of the latch circuit 43-1 is connected to the gate of an N-channel transistor 55 which supplies low-potential side power supply potential, for example, ground potential to the inverter circuit 51 and the gate of a P-channel transistor 57 of the transfer circuit 53. Further, the output of the latch circuit 43-1 is connected to the gate of a P-channel transistor 59 which supplies high-potential side power supply potential to the inverter circuit 51 and the gate of an N-channel transistor 61 of the transfer circuit 53. An input of the latch circuit 43-1 is set at the "H" level and an output thereof is set at the "L" level. Therefore, the inverting passage (inverter circuit 51) of the address comparison/transmission circuit 43-2 is made conductive and the non-inverting passage thereof (transfer circuit 53) is interrupted.

Next, the fuse circuit control signals TUP, TUN are both transited from the "L" level to the "H" level. As a result, the transistor 47 shown in FIG. 10 is changed from the ON state to the OFF state and the transistor 49 is changed from the OFF state to the ON state. The source of the transistor 49 is connected to the low-potential side power supply, for example, ground terminal 65 via a fuse 63.

If the fuse 63 is not cut, an input of the latch circuit 43-1 is inverted from the "H" level to the "L" level via the transistor 49 and fuse. Further, an output of the latch circuit 43-1 is inverted from the "L" level to the "H" level. As a result, the inverting passage (inverter circuit 41) of the address comparison/transmission circuit 43-2 is interrupted and the non-inverting passage thereof (transfer circuit 53) is made conductive. Therefore, the address input ADi passes through the address comparison/transmission circuit 43-2 without inverting the logic thereof. An address input FADi is an address input subjected to the inversion/non-inversion control operation and output from the address comparison/transmission circuit 43-2. The address input FADi is referred to as a compared address input FADi.

On the other hand, if the fuse 63 is cut, an input of the latch circuit 43-1 is kept at the "H" level and an output thereof is kept at the "L" level. The inverting passage (inverter circuit 41) of the address comparison/transmission circuit 43-2 keeps the conductive state and the non-inverting passage (transfer circuit 53) thereof keeps the nonconductive state. Therefore, the logic of the address input ADi is inverted while the address input is passing through the address comparison/transmission circuit 43-2.

The address comparison/transmission circuit 43-2 performs the control operation to invert/non-invert the logic of the address input ADi to "the logic which determines the hit" and "the logic which determines the miss-hit" according to cut/non-cut of the fuse 63. Thus, the compared address input FADi is generated. The compared address input FADi is supplied to a miss-hit/hit determination circuit 43-3 shown in FIG. 11.

The miss-hit/hit determination circuit 43-3 receives a predetermined number of compared addresses FADi. The miss-hit/hit determination circuit 43-3 of this example receives "i+j" compared addresses FADi, FADi+1, ..., FADi+j. The "i+j" compared addresses FADi to FADi+j are respectively input to the gates of N-channel transistors 67i, 67i+1, ..., 67i+j. The drains of the transistors 67i to 67i+j are connected to a common node 69. One end of the common node is connected to a high-potential power supply terminal 73 via the current path of a P-channel transistor 71 and the other end thereof is connected to a buffer circuit 75. Further, the sources of the transistors 67i to 67i+j are connected to a low-potential power supply terminal, for example, ground terminal 79 via the current path of an N-channel transistor 77.

A miss-hit/hit determination circuit control signal BACT is input to the gates of the transistors 71, 77. First, the signal BACT is set at the "L" level. At this time, the transistor 71 is set in the ON state and the transistor 77 is set in the OFF state. The common node 69 is charged to the "H" level.

Next, the compared address inputs FADi to FADi+j are input and the signal BACT transits from the "L" level to the "H" level. As a result, the transistor 71 is changed from the ON state to the OFF state and the transistor 77 is changed from the OFF state to the ON state.

At this time, if at least one of the transistors 67i to 67i+j is set in the ON state, that is, if one of the compared address inputs FADi to FADi+j is set at the "H" level, the potential of the common node 69 transits from the "H" level to the "L" level. This indicates the miss-hit. An output MISSHIT of the buffer circuit 75 transits from the "H" level to the "L" level. The main decoder 45M is enabled and the row or column of the main memory cell array 1 is selected according to the address inputs ADi to ADi+j.

If the transistors 67i to 67i+j are all set in the OFF state, that is, if the compared address inputs FADi to FADi+j are all set at the "L" level, the potential of the common node 69 is kept at the "H" level. This indicates the hit. The output MISSHIT of the buffer circuit 75 is kept at the "H" level.

The main decoder 45M is disabled and the redundant decoder 45R is enabled to select the redundant row or redundant column of the redundant memory cell array 3.

Thus, in this example, the operation of programming an address of the faulty row into the fuse circuit 41, for example, may be performed by cutting/non-cutting the fuse 63 to set each of the logic levels of the compared address inputs FADi to FADi+j at the "L" level.

SECOND EMBODIMENT

In the first embodiment, the write wiring is a row line, for example, a write word line, but the write wiring may be a column line, for example, a bit line. In the second embodiment, the write wiring is a column line. Further, the second embodiment shows an example of a current peak suppression circuit in which the number of transistors necessary for the current peak suppression circuit can be reduced, for example.

Figure 13:
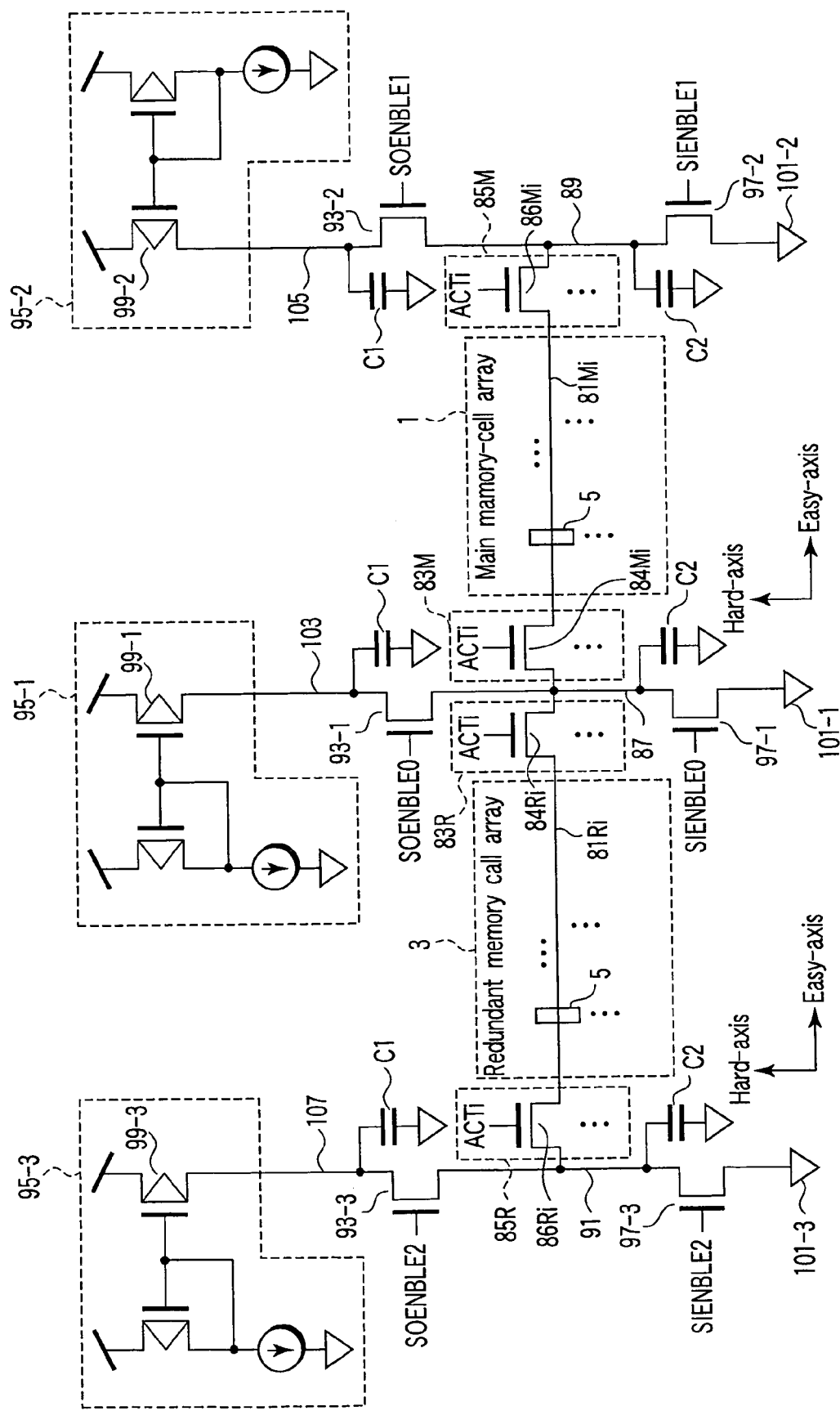
FIG. 13 is a circuit diagram showing one example of the circuit of a semiconductor integrated circuit device according to a second embodiment of this invention.

FIG. 13 is a circuit diagram showing one example of the circuit of a semiconductor integrated circuit device according to the second embodiment of this invention.

As shown in FIG. 13, a plurality of main column lines 81M are arranged in a main memory cell array 1 and a plurality of redundant column lines 81R are arranged in a redundant memory cell array 3. In FIG. 13, an i-th main column line 81Mi and an i-th redundant column line 81Ri are shown. If row lines 7M, 7R (not shown) are formed to extend in a hard-axis direction of the MTJ element in a memory cell 5, the column lines 81M, 81R are formed to extend in an easy-axis direction which intersects the hard-axis direction. One example of the column lines 81M, 81R is a bit line. In the following explanation, the main column lines 81M are referred to as main bit lines 81M and the redundant column lines 81R are referred to as redundant bit lines 81R.

One-side ends of the main bit lines 81M are connected to one end port of a selector 83M and the other ends thereof are connected to one end port of a selector 85M. Likewise, one-side ends of the redundant bit lines 81R are connected to one end port of a selector 83R and the other ends thereof are connected to one end port of a selector 85R. The other end port of the selector 83M and the other end port of the selector 83R are connected to a common node 87. The other end port of the selector 85M is connected to a common node 89. The other end port of the selector 85R is connected to a common node 91.

One end of the common node 87 is connected to a current source 95-1 via a switch 93-1. Likewise, one end of the common node 89 is connected to a current source 95-2 via a switch 93-2 and one end of the common node 91 is connected to a current source 95-3 via a switch 93-3. The current sources 95-1 to 95-3 of this example are configured by use of current mirror circuits.

The selector 83M contains N-channel transistors 84M. One-side ends of the current paths of the transistors 84M are respectively connected to the main bit lines 81M and the other ends thereof are connected to the common node 87. Outputs ACT of the decoder are respectively supplied to the gates of the transistors 84M. Likewise, the selector 83R contains N-channel transistors 84R. One-side ends of the current paths of the transistors 84R are respectively connected to the redundant bit lines 81R and the other ends thereof are connected to the common node 87. Outputs ACT of the decoder are respectively supplied to the gates of the transistors 84R.

The selector 85M contains N-channel transistors 86M. One-side ends of the current paths of the transistors 86M are respectively connected to the main bit lines 81M and the other ends thereof are connected to the common node 89. Outputs ACT of the decoder are respectively supplied to the gates of the transistors 86M. Likewise, the selector 85R contains N-channel transistors 86R. One-side ends of the current paths of the transistors 86R are respectively connected to the redundant bit lines 81R and the other ends thereof are connected to the common node 91. Outputs ACT of the decoder are respectively supplied to the gates of the transistors 86R.

The switches 93-1 to 93-3, 97-1 to 97-3 have a role as a bit line sinker. For example, if the bit line is formed to extend in an easy-axis direction as in this example, the direction of the write current is changed according to write data. For example, assume that a write current is caused to flow from the selector 83M to the selector 85M when write data "0" is supplied to the bit line 81M of the main memory cell array 1. In this case, when write data "1" is supplied, the write current is caused to flow in a reverse direction from the selector 85M to the selector 83M. In the redundant memory cell array 3, the same operation is performed. The switches 93-1 to 93-3, 97-1 to 97-3 control the direction of the current.

For example, assume that the bit line 81Mi of the main memory cell array 1 is selected and write data "0" is given. In this case, the switch 93-1 is set in the ON state, the switches 97-1, 93-2 are set in the OFF state and the switch 97-2 is set in the ON state. As a result, the write current flows from the current source 95-1 to a ground terminal 101-2 via the bit line 81Mi.

On the other hand, assume that write data "1" is given. In this case, the switch 93-2 is set in the ON state, the switches 97-2, 93-1 are set in the OFF state and the switch 97-1 is set in the ON state. As a result, the write current flows from the current source 95-2 to a ground terminal 101-1.

In the device according to the second embodiment, for example, the current source 95-1 which supplies a write current to the column lines, for example, bit lines 81M, 81R is commonly used by the main memory cell array 1 and redundant memory cell array 3. Therefore, the number of current sources 95-1 can be reduced in comparison with the device having the current sources 95-1 respectively provided for the main memory cell array 1 and redundant memory cell array 3. As a result, like the first embodiment, in the second embodiment, it is advantageous in miniaturizing the semiconductor chip.

Further, in the second embodiment, another example of the current peak suppression circuit is shown.

In the second embodiment, the switches 93-1 to 93-3 and 97-1 to 97-3 play a role of the current peak suppression circuit. One example of the switches 93-1 to 93-3 and 97-1 to 97-3 is an N-channel transistor. In the following explanation, the switches 93-1 to 93-3 and 97-1 to 97-3 are referred to as transistors 93-1 to 93-3 and 97-1 to 97-3. One-side ends of the current paths of the transistors 93-1 to 93-3 are respectively connected to the common nodes 87, 89 and 91 and the other ends thereof are connected to the drains of P-channel driver transistors 99-1 to 99-3 of the current sources 95-1 to 95-3. The gate of the transistor 93-1 is supplied with a control signal SOENBLE0, the gate of the transistor 93-2 is supplied with a control signal SOENBLE1 and the gate of the transistor 93-3 is supplied with a control signal SOENBLE2. One-side ends of the current paths of the transistors 97-1 to 97-3 are respectively connected to the common nodes 87, 89 and 91 and the other ends thereof are connected to low-potential power supply terminals, for example, ground node power supply terminals 101-1 to 101-3. The gate of the transistor 97-1 is supplied with a control signal SIENBLE0, the gate of the transistor 97-2 is supplied with a control signal SIENBLE1 and the gate of the transistor 97-3 is supplied with a control signal SIENBLE2.

Next, one example of the control operation of the transistors 93, 97 is explained.

Figure 14:
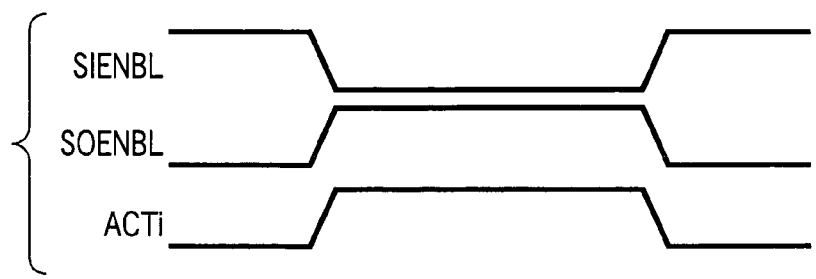
FIG. 14 is a signal waveform diagram showing one example of the control operation of transistors 93, 97 shown in FIG. 13.

FIG. 14 is a signal waveform diagram showing one example of the control operation of the transistors 93, 97 shown in FIG. 13.

As shown in FIG. 14, the signal SIENBLE is set at the "H" level, the signal SOENBLE is set at the "L" level and the decoder output ACTi is set at the "L" level before the write operation. In this state, the transistor 97 is set in the ON state and the transistors 93, 84, 86 are set in the OFF state.

Since the transistor 93 is set in the OFF state, the connection node 103 (or 105, 107) of the transistor 93 and the current source 95 is disconnected from the common connection node 87 (or 89, 91). At this time, the current source 95 is set in the ON state so as to charge the parasitic capacitor C1 of the connection node 103 (or 105, 107).

Further, since the transistor 97 is set in the ON state, the common node 87 (or 89, 91) is connected to the ground terminal 101-1. As a result, the parasitic capacitor C2 of the common node 87 (or 89, 91) is discharged.

If the decoder output ACTi is transited from the "L" level to the "H" level, the transistors 84M (or 84R), 86M (or 86R) are changed form the OFF state to the ON state. At the same time as or before or after transition of the decoder output ACTi from the "L" level to the "H" level, the signal SIENBL is transited from the "H" level to the "L" level and the signal SOENBL is transited from the "L" level to the "H" level. Then, the transistor 93 is changed from the OFF state to the ON state and the transistor 97 is changed from the ON state to the OFF state. Charges stored on the parasitic capacitor C1 are discharged toward the parasitic capacitor C2. By thus causing the charges stored on the parasitic capacitor C1 to be discharged, excessive peak currents caused in the write wirings, for example, the bit lines 81M, 81R in this example can be absorbed by the parasitic capacitor C2. Therefore, the current peaks caused in the write wirings, for example, the bit lines 81M, 81R in this example can be suppressed.

Thus, the current peak suppression circuit can be connected to the common nodes 87, 89, 91. For example, like the first embodiment, if the current peak suppression circuit is connected to the common nodes 87, 89, 91, the number of elements or the number of transistors can be reduced in comparison with a case wherein the current peak suppression circuits are respectively connected to one-side ends of the write wirings. Therefore, the current peak suppression circuit of the second embodiment has an advantage over the current peak suppression circuit of the first embodiment in that the semiconductor chip can be favorably miniaturized. However, the current peak suppression circuit is not limited to the second embodiment. It is desirable to select an optimum one of the current peak suppression circuits of the first and second embodiments in this device.

Figure 15:
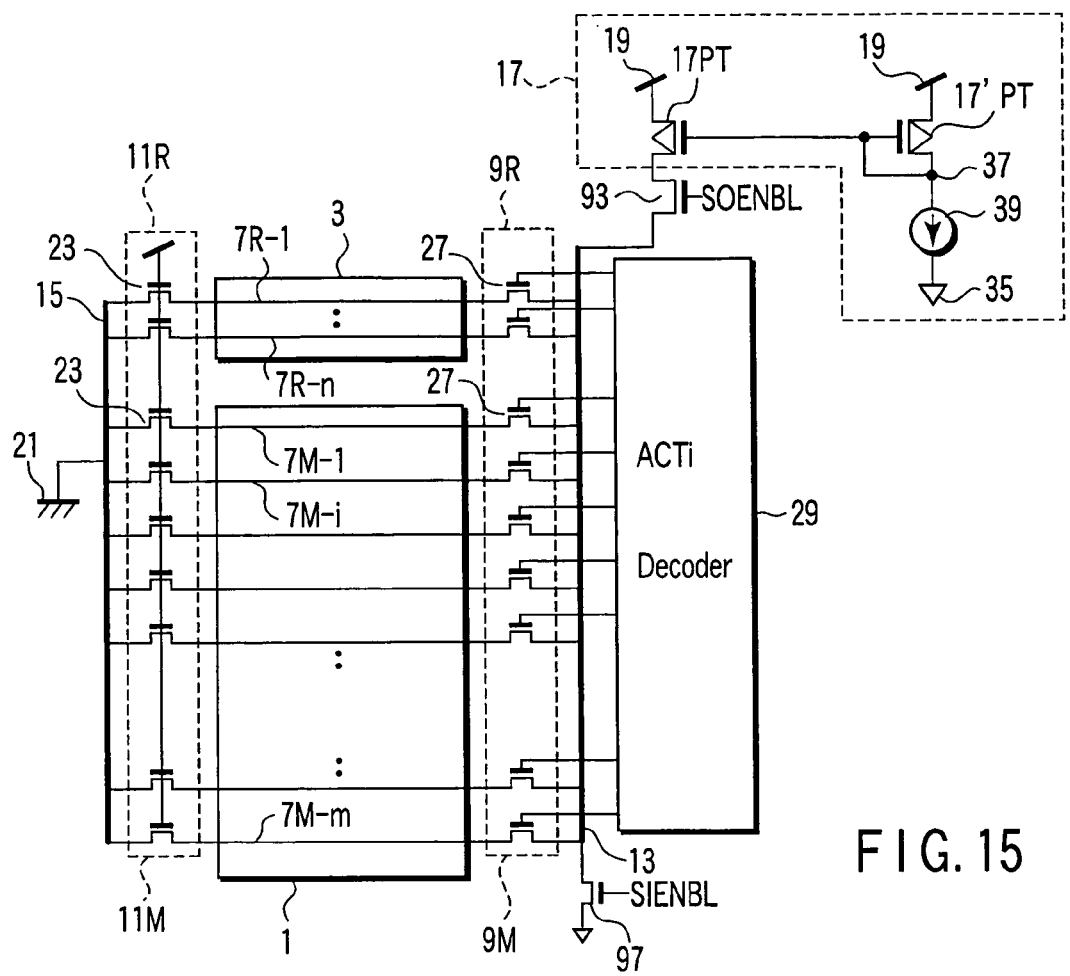
FIG. 15 is a circuit diagram showing one example of the circuit of a semiconductor integrated circuit device according to a modification of the second embodiment of this invention.

FIG. 15 is a circuit diagram showing one example of the circuit of a semiconductor integrated circuit device according to a modification of the second embodiment of this invention.

As shown in FIG. 15, the current peak suppression circuit of the second embodiment can be used in a case where write wirings are row lines, for example, write word lines 7M, 7R. In this case, the switch 93, for example, transistor 93 is connected between one end of the common node 13 and the current source 17 and the switch 97, for example, transistor 97 is connected between the other end of the common node 13 and the ground terminal.

The operation is the same as that of the device shown in FIG. 13 and the explanation thereof is omitted.

Thus, the current peak suppression circuit of the second embodiment can be used in a case where the write wirings are row lines, for example, write word lines 7M, 7R.

Although not shown in the drawing, like the current peak suppression circuit of the second embodiment, the current peak suppression circuit of the first embodiment can be used in a case where the write wirings are column lines, for example, bit lines. That is, the current peak suppression circuit, for example, selectors 31M, 31R can be connected to one-side ends of the main bit lines 81M and one-side ends of the redundant bit lines.

Next, one example of the layout of the device according to the second embodiment is explained.

Figure 16:
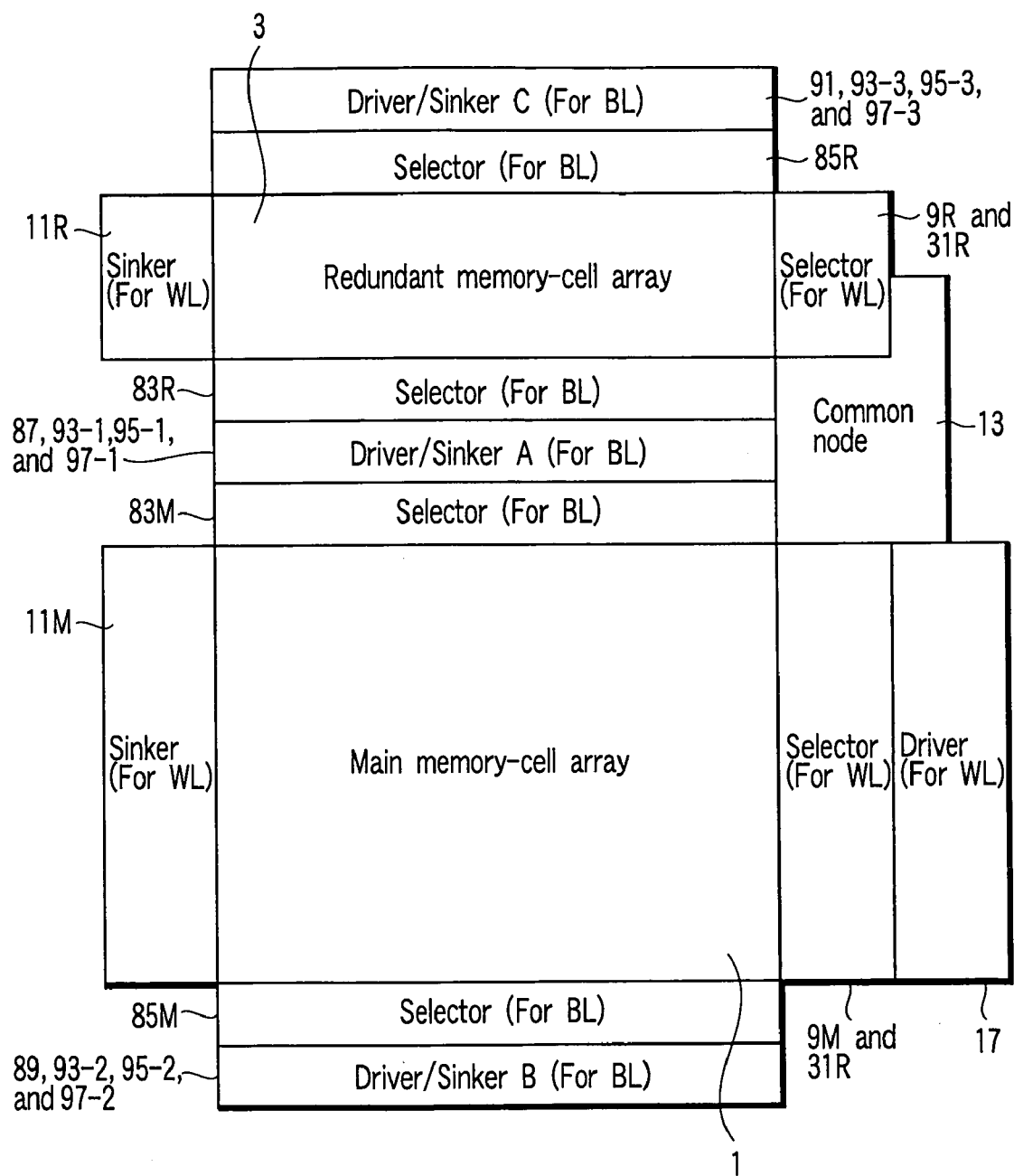
FIG. 16 is a plan view showing one example of the layout of the device according to the second embodiment of this invention.

FIG. 16 is a plan view showing one example of the layout of the device according to the second embodiment of this invention.

As shown in FIG. 16, the common node 87 is arranged between the main memory cell array 1 and the redundant memory cell array 3. In this example, the common node 87 is arranged in a region indicated by a bit line driver/sinker A in FIG. 16 together with the switches 93-1, 97-1, current source 95-1. The bit line driver/sinker A is arranged between the main memory cell array 1 and the redundant memory cell array 3. A bit line driver/sinker B is arranged in opposition to the bit line driver/sinker A with the main memory cell array 1 disposed therebetween. In a region of the bit line driver/sinker B, the common node 89, switches 93-2, 97-2, current source 95-2 are arranged. A bit line driver/sinker C is arranged in opposition to the bit line driver/sinker A with the redundant memory cell array 3 disposed therebetween. In a region of the bit line driver/sinker C, the common node 91, switches 93-3, 97-3, current source 95-3 are arranged.

The selector 83M is arranged between the bit line driver/sinker A and the main memory cell array 1 and the selector 83R is arranged between the bit line driver/sinker A and the redundant memory cell array 3. The selector 85M is arranged between the bit line driver/sinker B and the main memory cell array 1 and the selector 85R is arranged between the bit line driver/sinker C and the redundant memory cell array 3.

Further, in the example of the layout shown in FIG. 16, the current source 17 is commonly used for the row lines, for example, write word lines of the main memory cell array 1 and redundant memory cell array 3.

The current source 17 is arranged in a region indicated by a word line driver in FIG. 16. The word line driver is arranged along one side of the main memory cell array 1 on which none of the bit line drivers/sinkers A, B are arranged. A common node 13 is formed to extend from the word line driver to the redundant memory cell array 3.

The selectors (word line selectors) 9M, 31M are arranged between the word line driver and the main memory cell array 1 and the selector (word line sinker) 11M is arranged in opposition to the selectors (word line selectors) 9M, 31M with the main memory cell array 1 disposed therebetween.

The selectors (word line selectors) 9R, 31R are arranged along one side of the redundant memory cell array 3 on which none of the bit line drivers/sinkers A, C are arranged and they are arranged between the common node 13 and the redundant memory cell array 3. The selector (word line sinker) 11R is arranged in opposition to the selectors (word line selectors) 9R, 31R with the redundant memory cell array 3 disposed therebetween.

In the above layout example, the current source 95-1 can be commonly used by the main memory cell array 1 and redundant memory cell array 3 by arranging the common node 87 between the main memory cell array 1 and the redundant memory cell array 3.

Further, as in the above layout example, a column line power supply, for example, the current source 95-1 can be commonly used by the main memory cell array 1 and redundant memory cell array 3 and a row line power supply, for example, the current source 17 can be commonly used by the main memory cell array 1 and redundant memory cell array 3. The above layout example is also advantageous in miniaturizing the semiconductor chip.

THIRD EMBODIMENT

The third embodiment is an example of a device having a plurality of memory cell arrays 1.

Figure 17:
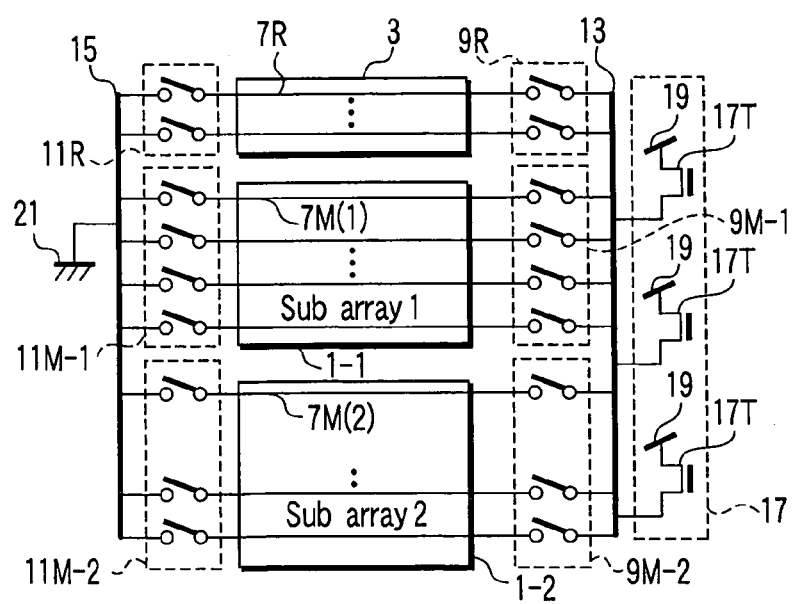
FIG. 17 is a block diagram showing one example of the configuration of a semiconductor integrated circuit device according to a third embodiment of this invention.

FIG. 17 is a block diagram showing one example of the configuration of a semiconductor integrated circuit device according to the third embodiment of this invention.

As shown in FIG. 17, the third embodiment is an example in which the main memory cell array 1 of the first embodiment shown in FIG. 1 is provided as a sub array configuration and a plurality of main memory cell arrays 1 are used. In this example, a main memory cell array (sub array) 1-1 and main memory cell array (sub array) 1-2 are provided. The main memory cell array 1-2 is arranged apart from the main memory cell array 1-1.

The redundant memory cell array 3 and main memory cell arrays 1-1, 1-2 are arranged along the common node 13. The current source 17 is commonly used by the main memory cell arrays 1-1, 1-2 and redundant memory cell array 3 via the common node 13.

The other portions are the same as those of the device of the first embodiment, portions which are common to those of FIG. 1 are denoted by the same reference symbols and the explanation thereof is omitted.

When a plurality of main memory cell arrays 1 are thus provided, the current source 17 can be commonly used by the plurality of main memory cell arrays 1-1, 1-2 and redundant memory cell array 3.

Figure 18:
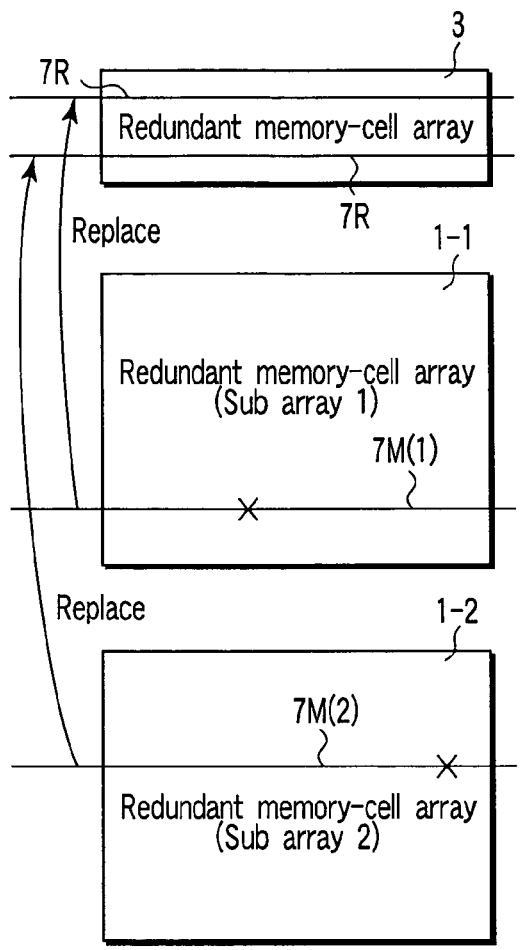
FIG. 18 is a diagram showing a first example of the relief operation of the semiconductor integrated circuit device according to the third embodiment of this invention.
Figure 19:
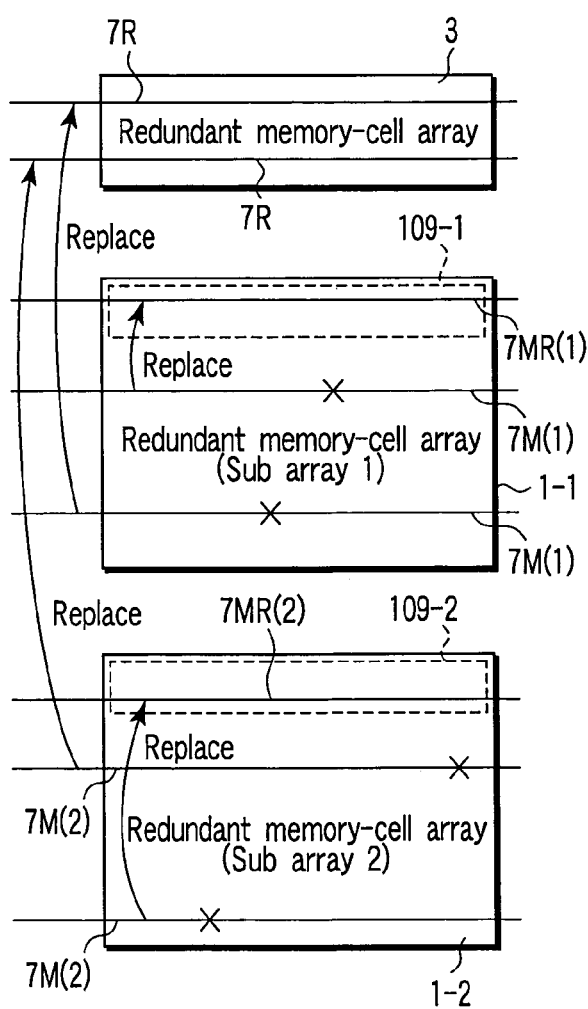
FIG. 19 is a diagram showing a second example of the relief operation of the semiconductor integrated circuit device according to the third embodiment of this invention.

Further, as in the third embodiment, when the main memory cell array 1 is formed as the sub-array configuration, the redundant memory cell array 3 can cope with faults occurring in the main memory cell arrays 1-1, 1-2. FIGS. 18, 19 show examples of the relief operation.

FIG. 18 is a diagram showing a first example of the relief operation of the device according to the third embodiment of this invention.

As shown in FIG. 18, assume that a fault occurs in a memory cell connected to a row line, for example, a main write word line 7M(1) of the main memory cell array 1-1. A faulty row containing the main write word line 7M(1) is replaced by a row line of the redundant memory cell array 3, for example, a redundant row containing the redundant write word line 7R and thus it is relived. When a fault occurs in a memory cell connected to a row line, for example, a main write word line 7M(2) of the main memory cell array 1-2, a faulty row containing the main write word line 7M(2) is replaced by a row line of the redundant memory cell array 3, for example, a redundant row containing the redundant write word line 7R and thus it is relived.

Thus, the redundant memory cell array 3 which is arranged in a position apart from the main memory cell arrays 1-1, 1-2 can be used to cope with or compensate for the faults occurring in both of the main memory cell arrays 1-1, 1-2.

FIG. 19 is a diagram showing a second example of the relief operation of the device according to the third embodiment of this invention.

As shown in FIG. 19, like the first example of the relief operation, in the second example of the relief operation, the redundant memory cell array 3 can be used for relief of both of the main memory cell arrays 1-1, 1-2. The second example is different from the first example in that redundant memory cell regions 109-1, 109-2 are respectively provided in the main memory cell arrays 1-1, 1-2. The redundant memory cell region 109-1 is used to cope with a fault occurring in the main memory cell array 1-1 and the redundant memory cell region 109-2 is used to cope with a fault occurring in the main memory cell array 1-2. Assume that a fault occurs in the memory cell connected to a row line of the main memory cell array 1-1, for example, the main write word line 7M(1). The faulty row containing the main write word line 7M(1) is replaced by a row line of the redundant memory cell region 109-1, for example, a redundant row line containing the redundant write word line 7MR(1) and is thus relieved. Likewise, the faulty row containing the main write word line 7M(2) is replaced by a row line of the redundant memory cell region 109-2, for example, a redundant row line containing the redundant write word line 7MR(2) and is thus relieved.

The redundant memory cell array 3 can be used when all of the faulty rows cannot be relieved by use of the redundant memory cell regions 109-1, 109-2, for example. The example of the relief operation is the same as the first example of the relief operation and the explanation thereof is omitted.

In the first and second examples of the relief operation of the third embodiment, a case wherein the faulty row line occurs is explained as an example, but it is also possible to cope with a faulty column line. In this case, the row lines 7M(1), 7M(2), 7R, 7MR(1), 7MR(2) shown in FIGS. 17, 18, 19 may be read as column lines. One example of the column line is a bit line.

FOURTH EMBODIMENT

The fourth embodiment is an example of a device including a plurality of memory cell arrays 1 as in the third embodiment.

Figure 20:
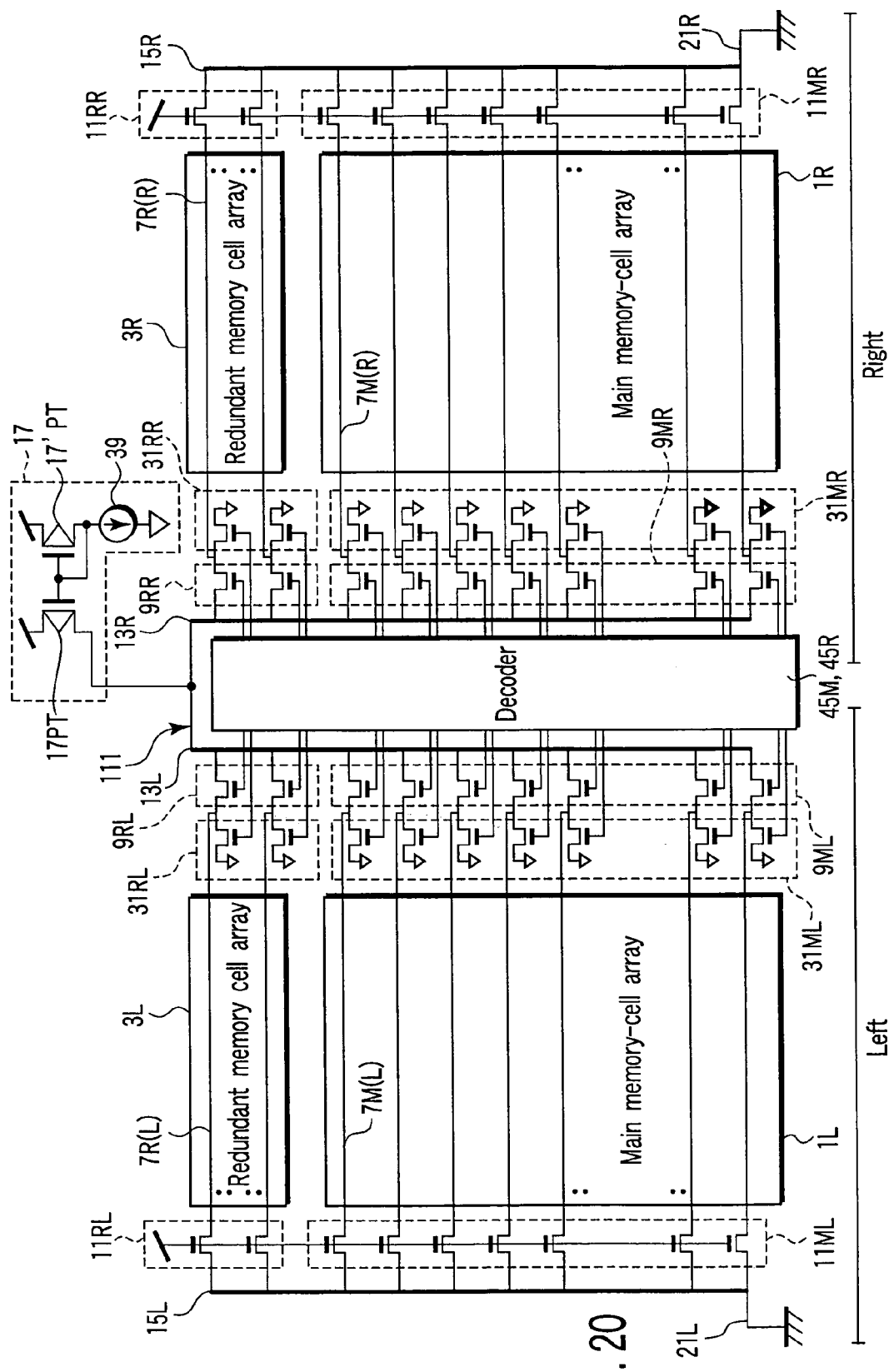
FIG. 20 is a block diagram showing one example of the configuration of a semiconductor integrated circuit device according to a fourth embodiment of this invention.

FIG. 20 is a block diagram showing one example of the configuration of the semiconductor integrated circuit device according to the fourth embodiment of this invention.

As shown in FIG. 20, the fourth embodiment is different from the third embodiment in that the main memory cell arrays 1 and redundant memory cell arrays 3 are arranged on the right and left positions on the drawing sheet. For example, the main memory cell array 1L is arranged in opposition to the main memory cell array 1R with common nodes 13 disposed therebetween. In this example, decoders 45M, 45R are arranged at the center and circuit portions including the main memory cell arrays 1, redundant memory cell arrays 3, common nodes 13, 15, selectors 9M, 9R, 11M, 11R, 31M, 31R are arranged in the left side region Left and in the right side region Right in a line symmetrical configuration with respect to the decoders 45M, 45R. A letter "L" is attached to the end of the reference symbol in the circuit portion arranged in the left side region Left and a letter "R" is attached to the end of the reference symbol in the circuit portion arranged in the right side region Right. The configurations and operations of the above circuit portions are the same as those of the device shown in FIG. 4, for example, and the explanation thereof is omitted.

The common node 13L and common node 13R are connected together via a connection node 111 in this example. The current source 17 is connected to the connection node 111. The current source 17 is commonly used by the common nodes 13L and 13R.

Thus, a plurality of main memory cell arrays 1 and redundant memory cell arrays 3 may be arranged with the common nodes 13 disposed therebetween, for example.

In the fourth embodiment, the current source 17 is commonly used by the main memory cell arrays 1 and redundant memory cell arrays 3. For example, the current source 17 is commonly used by the main memory cell arrays 1L, 1R and redundant memory cell arrays 3L, 3R. Therefore, like the above embodiments, the fourth embodiment is advantageous in miniaturizing the semiconductor chip.

FIFTH EMBODIMENT

The fifth embodiment is an example which is obtained by combining the third embodiment and fourth embodiment and in which memory cell arrays are arranged in a matrix form.

Figure 21:
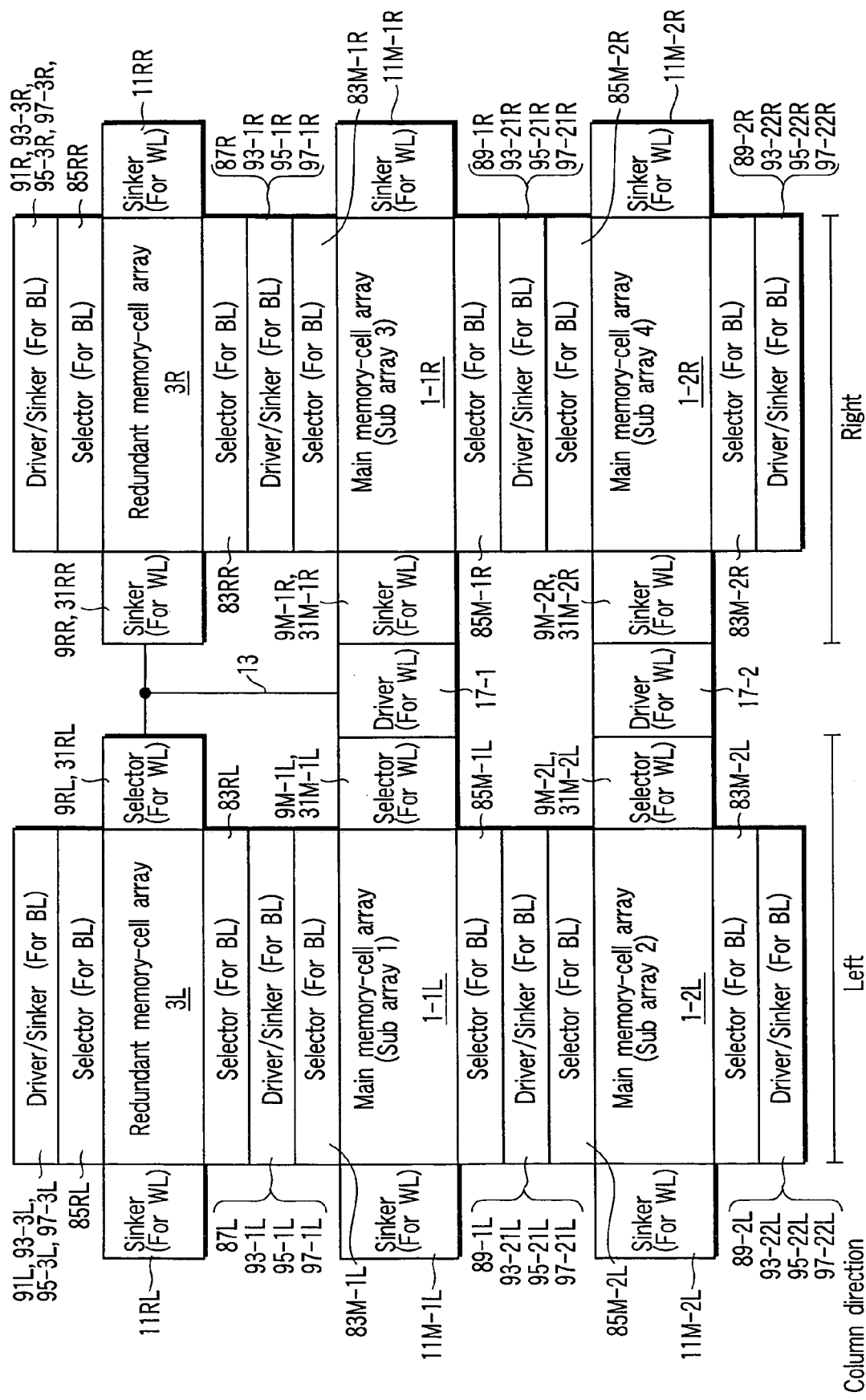
FIG. 21 is a block diagram showing one example of the configuration of a semiconductor integrated circuit device according to a fifth embodiment of this invention.

FIG. 21 is a block diagram showing one example of the configuration of a semiconductor integrated circuit device according to the fifth embodiment of this invention.

As shown in FIG. 21, in the fifth embodiment, main memory cell arrays 1-1L, 1-1R, 1-2L, 1-2R are arranged in row and column directions in a matrix form and redundant memory cell arrays 3L, 3R are arranged along the row direction. A current source 17-1 of this example is commonly used by the main memory cell arrays 1-1L, 1-1R and redundant memory cell arrays 3L, 3R. Further, a current source 17-2 is commonly used by the main memory cell arrays 1-2L, 1-2R.

The configuration and operation of the circuit of the fifth embodiment are the same as those of the device shown in FIG. 16, for example, and the explanation thereof is omitted.

Thus, the main memory cell arrays 1 and redundant memory cell arrays 3 may be arranged in a matrix form.

Also, in the fifth embodiment, the current source 17 is commonly used by the main memory cell arrays 1 and redundant memory cell arrays 3. For example, the current source 17-1 is commonly used by the main memory cell arrays 1-1L, 1-1R and redundant memory cell arrays 3L, 3R. Therefore, like the above embodiments, the fifth embodiment is also advantageous in miniaturizing the semiconductor chip.

SIXTH EMBODIMENT

The sixth embodiment is an example of a memory cell 5.

FIRST EXAMPLE

Figure 22:
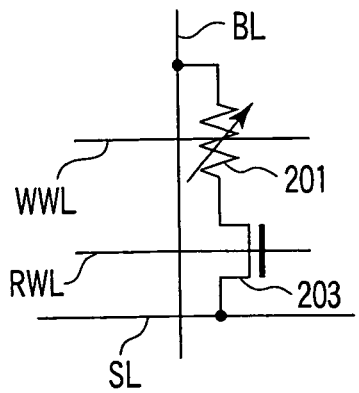
FIG. 22 is an equivalent circuit diagram showing the equivalent circuit of a memory cell of a first example.
Figure 23:
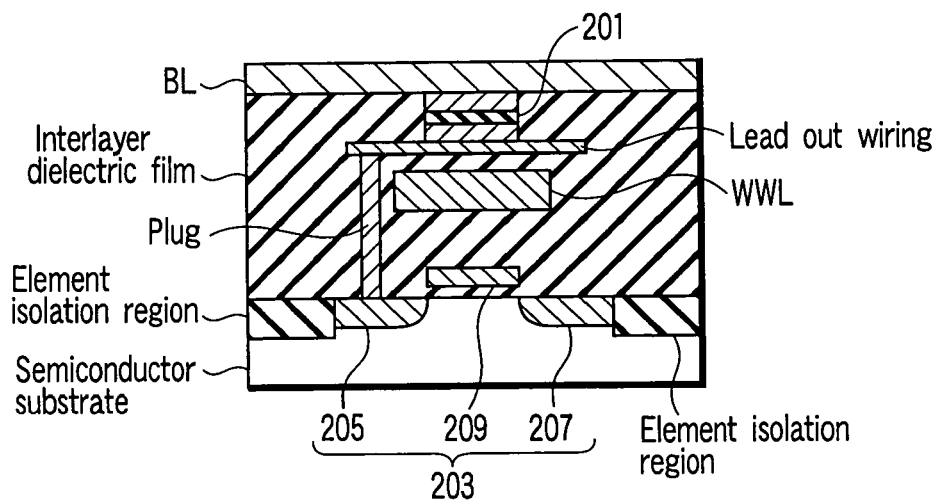
FIG. 23 is a cross sectional view showing an example of the cross section of the memory cell of the first example.

FIG. 22 is an equivalent circuit diagram showing the equivalent circuit of a memory cell of a first example and FIG. 23 is a cross sectional view showing an example of the cross section of the memory cell of the first example.

As shown in FIGS. 22, 23, a memory cell 5A of the first example includes a one-magneto-resistance effect element/one-transistor type cell including one magneto-resistance effect element 201 and one selection transistor 203. One example of the magneto-resistance effect element 201 is an MTJ (Magnetic Tunnel Junction) element. The memory cells 5A are arranged at intersections between bit lines BL and word lines (read word lines RWL, write word lines WWL).

One end of the current path of the magneto-resistance effect element 201 is connected to the bit line BL and the other end thereof is connected to one end of the current path of the selection transistor 203, for example, the drain 205. The other end of the current path of the selection transistor 203, for example, the source 207 is connected to a source line SL. The gate 209 of the selection transistor 203 is connected to the read word line RWL. The write word line WWL intersects with the bit line BL. The magneto-resistance effect elements 201 are arranged at the intersections between the bit lines BL and the write word lines WWL.

The one-magneto-resistance effect element/one-transistor type cell 5A can be used as the memory cell 5 of the device according to the above embodiments.

SECOND EXAMPLE

Figure 24:
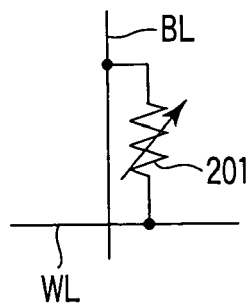
FIG. 24 is an equivalent circuit diagram showing the equivalent circuit of a memory cell of a second example.
Figure 25:
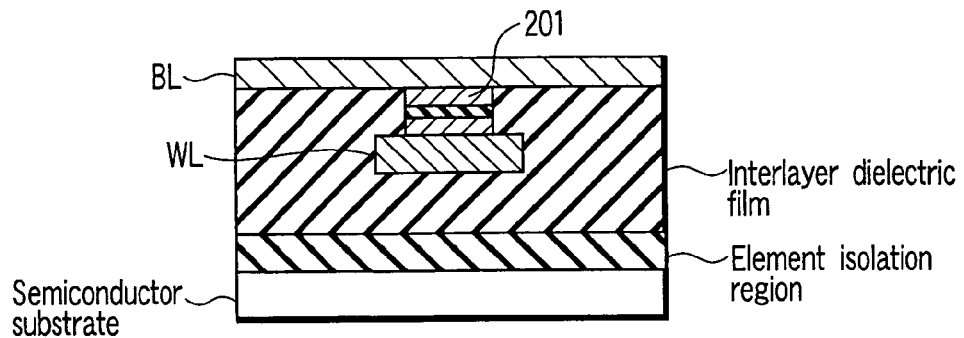
FIG. 25 is a cross sectional view showing an example of the cross section of the memory cell of the second example.

FIG. 24 is an equivalent circuit diagram showing the equivalent circuit of a memory cell of a second example and FIG. 25 is a cross sectional view showing an example of the cross section of the memory cell of the second example.

As shown in FIGS. 24, 25, a memory cell 5B of the second example is a cross-point type cell having one magneto-resistance effect element 201 arranged at the intersection between the bit line BL and the word line WL. Like the first example, one example of the magneto-resistance effect element 201 is an MTJ element. Like the bit line BL, the word line WL of the cross-point type cell 5B is used for both of the read operation and write operation.

The cross-point type cell 5B can be used as the memory cell 5 of the device according to the above embodiments.

THIRD EXAMPLE

Figure 26:
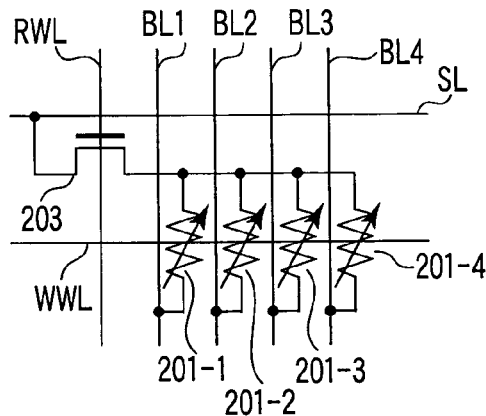
FIG. 26 is an equivalent circuit diagram showing the equivalent circuit of a memory cell of a third example.
Figure 27:
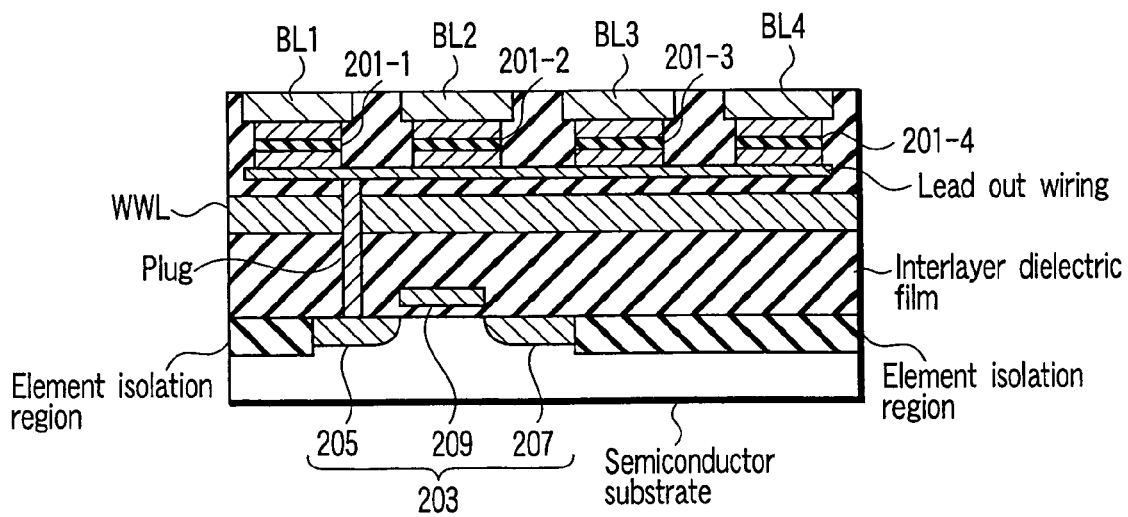
FIG. 27 is a cross sectional view showing an example of the cross section of the memory cell of the third example.

FIG. 26 is an equivalent circuit diagram showing the equivalent circuit of a memory cell of a third example and FIG. 27 is a cross sectional view showing an example of the cross section of the memory cell of the third example.

As shown in FIGS. 26, 27, a memory cell 5C of the third example is an N-magneto-resistance effect element/one-transistor type cell having N magneto-resistance effect elements 201 arranged at intersections between bit lines BL and a word line WL. Like the first and second examples, one example of the magneto-resistance effect element 201 is an MTJ element. In this example, the memory cell 5C in the case of "N=4" is shown as one example. One-side ends of the current paths of the magneto-resistance effect elements 201-1 to 201-4 are respectively connected to bit lines BL1 to BL4 and the other ends thereof are commonly connected to a lead-out wiring. For example, the lead-out wiring is connected to one end of the current path, for example, drain 205 of a selection transistor 203 via a plug formed in a contact hole in an inter-level insulating film. The other end of the current path, for example, source 207 of the selection transistor 203 is connected to a source line SL. A wire word line WWL is formed below the lead-out wiring and the magneto-resistance effect elements 201-1 to 201-4 are arranged at intersections between the bit lines BL1 to BL4 and the write word line WWL.

As the memory cells 5 of the device in the above embodiment, N-magneto-resistance effect element/one-transistor type cells 5C can be used.

According to the present embodiment of this invention, a semiconductor integrated circuit device which has memory cells each including at least one magneto-resistance effect element and in which the area occupied by the write current source in the whole chip area can be reduced can be provided.

This invention has been explained with reference to several embodiments. However, this invention is not limited to the above embodiments and can be variously modified without departing from the technical scope thereof when embodying this invention. For example, the N-channel transistors are used in the selectors or the like, but P-channel transistors can be adequately used instead thereof.

The embodiments can be independently performed, but they can be adequately combined and performed.

Further, the above embodiments contain inventions of various stages and the inventions of various stages can be extracted by adequately combining a plurality of constituents disclosed in the embodiments.

Further, the embodiments are explained based on the examples in which the invention is applied to the magnetic semiconductor memory, but this invention is not limited to the magnetic semiconductor memory. A semiconductor integrated circuit device containing the magnetic semiconductor memory, for example, a processor or system LSI is also contained in the scope of this invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
   a main memory cell array having memory cells arranged in a matrix form and including at least one magneto-resistance effect element;
   a redundant memory cell array having memory cells arranged in a matrix form and including at least one magneto-resistance effect element used to compensate for a fault occurring in the main memory cell array, the redundant memory cell array being formed independently of the main memory cell array and arranged in a position apart from the main memory cell array;
   main write wirings arranged on the main memory cell array;
   redundant write wirings arranged on the redundant memory cell array;
   a write current source;
   a common node connected to the write current source;
   a first selector connected between the common node and one-side ends of the main write wirings;
   a second selector connected between the common node and one-side ends of the redundant write wirings;
   a third selector connected to the other ends of the main write wirings; and
   a fourth selector connected to the other ends of the redundant write wirings.

2. The device according to claim 1, further comprising a current peak suppression circuit which suppresses current peaks of write currents flowing through the main and redundant write wirings, the current peak suppression circuit being connected to one-side ends of the main and redundant write wirings.

3. The device according to claim 1, further comprising a current peak suppression circuit which suppresses current peaks of write currents flowing through the main and redundant write wirings, the current peak suppression circuit being connected to the common node.

4. The device according to claim 1, further comprising: a second main memory cell array arranged in a position apart from the main memory cell array and having memory cells arranged in a matrix form and including at least one magneto-resistance effect element;
   second main write wirings arranged on the main memory cell array;
   a fifth selector connected between the common node and one-side ends of the second main write wirings; and
   a sixth selector connected to the other ends of the second main write wirings.

5. The device according to claim 4, wherein the redundant memory cell array is used to compensate for a fault occurring in the main memory cell array and a fault occurring in the second main memory cell array.

6. The device according to claim 5, wherein the redundant memory cell array, main memory cell array and second main memory cell array are arranged along the common node.

7. The device according to claim 4, further comprising:
   a second redundant memory cell array arranged in a position apart from the main memory cell array and having memory cells arranged in a matrix form and including at least one magneto-resistance effect element used to compensate for a fault occurring in the main memory cell array;
   second redundant write wirings arranged on the second redundant memory cell array;
   a seventh selector connected between the common node and one-side ends of the second redundant write wirings; and
   an eighth selector connected to the other ends of the second redundant write wirings,
   wherein the redundant memory cell array and main memory cell array are arranged along the common node and the second redundant memory cell array and second main memory cell array are arranged in opposition to the redundant memory cell array and main memory cell array with the common node disposed therebetween.

8. The device according to claim 1, wherein the write wirings are write word lines.

9. The device according to claim 1, wherein the write wirings are bit lines.

10. A semiconductor integrated circuit device comprising:
   a main memory cell array having memory cells arranged in a matrix form and including at least one magneto-resistance effect element;
   a redundant memory cell array having memory cells arranged in a matrix form and including at least one magneto-resistance effect element used to compensate for a fault occurring in the main memory cell array, the redundant memory cell array being arranged in a position apart from the main memory cell array;
   main write word lines arranged on the main memory cell array;
   main bit lines arranged on the main memory cell array;
   redundant write word lines arranged on the redundant memory cell array;
   redundant bit lines arranged on the redundant memory cell array;
   a write current source for the write word lines;
   a common node for the write word lines connected to the write current source for the write word lines;
   a first selector connected between the common node for the write word lines and one-side ends of the main write word lines;
   a second selector connected between the common node for the write word lines and one-side ends of the redundant write word lines;
   a third selector connected to the other ends of the main write word lines;
   a fourth selector connected to the other ends of the redundant write word lines;
   a write current source for the bit lines;
   a common node for the bit lines connected to the write current source for the bit lines;
   a fifth selector connected between the common node for the bit lines and one-side ends of the main bit lines;
   a sixth selector connected between the common node for the bit lines and one-side ends of the redundant bit lines;
   a seventh selector connected to the other ends of the main bit lines; and
   an eighth selector connected to the other ends of the redundant bit lines.

11. The device according to claim 10, further comprising a first current peak suppression circuit which suppresses current peaks of write currents flowing through the main and redundant write word lines, the first current peak suppression circuit being connected to one-side ends of the main and redundant write word lines.

12. The device according to claim 10, further comprising a first current peak suppression circuit which suppresses current peaks of write currents flowing through the main and redundant write word lines, the first current peak suppression circuit being connected to the common node for the write word lines.

13. The device according to claim 10, further comprising a second current peak suppression circuit which suppresses current peaks of write currents flowing through the bit lines and redundant bit lines, the second current peak suppression circuit being connected to one-side ends of the main and redundant bit lines.

14. The device according to claim 13, further comprising a second current peak suppression circuit which suppresses current peaks of write currents flowing through the bit lines and redundant bit lines, the second current peak suppression circuit being connected to the common node for the bit lines.

15. The device according to claim 10, further comprising:
   a second main memory cell array arranged in a position apart from the main memory cell array and having memory cells arranged in a matrix form and including at least one magneto-resistance effect element;
   second main write word lines arranged on the second main memory cell array;
   second main bit lines arranged on the second main memory cell array;
   a ninth selector connected between the common node for the write word lines and one-side ends of the second main write word lines;
   a tenth selector connected to the other ends of the second main write word lines;
   an eleventh selector connected between the common node for the bit lines and one-side ends of the second main bit lines; and
   a twelfth selector connected to the other ends of the second main bit lines.

16. The device according to claim 15, wherein the redundant memory cell array is used to compensate for a fault occurring in the main memory cell array and a fault occurring in the second main memory cell array.

17. The device according to claim 16, wherein the redundant memory cell array, main memory cell array and second main memory cell array are arranged along the common node for the write word lines.

18. The device according to claim 17, wherein the common node for the bit lines is arranged between the redundant memory cell array and the main memory cell array.

19. The device according to claim 15, further comprising:
a second redundant memory cell array arranged in a position apart from the main memory cell array and having memory cells arranged in a matrix form and including at least one magneto-resistance effect element used to compensate for a fault occurring in the main memory cell array;
second redundant write word lines arranged on the second redundant memory cell array;
second redundant bit lines arranged on the second redundant memory cell array;
a thirteenth selector connected between the common node for the write word lines and one-side ends of the second redundant write word lines;
a fourteenth selector connected to the other ends of the second redundant write word lines;
a fifteenth selector connected between the common node for the bit lines and one-side ends of the second redundant bit lines; and
a sixteenth selector connected to the other ends of the second redundant bit lines,
wherein the redundant memory cell array and main memory cell array are arranged along the common node and the second redundant memory cell array and second main memory cell array are arranged in opposition to the redundant memory cell array and main memory cell array with the common node disposed therebetween.

20. The device according to claim 19, wherein the common node for the bit lines is arranged between the redundant memory cell array and the main memory cell array and between the second redundant memory cell array and the second main memory cell array.

* * * * *